(12) United States Patent
Dimig et al.

(10) Patent No.: US 6,523,382 B1
(45) Date of Patent: Feb. 25, 2003

(54) FREE WHEELING LOCK ASSEMBLY

(75) Inventors: Steven J. Dimig, Plymouth, WI (US); Keith D. Zirtzlaff, Port Washington, WI (US); Alan J. Ritz, Brookfield, WI (US)

(73) Assignee: Strattec Security Corporation, Milwaukee, WI (US)

( * ) Notice: Subject to any disclaimer, the term of this patent is extended or adjusted under 35 U.S.C. 154(b) by 0 days.

(21) Appl. No.: 09/758,052

(22) Filed: Jan. 10, 2001

Related U.S. Application Data

(63) Continuation-in-part of application No. 09/566,837, filed on May 8, 2000, which is a continuation of application No. 09/149,334, filed on Sep. 8, 1998, now Pat. No. 6,058,751.

(51) Int. Cl.[7] .................................................. E05B 27/00
(52) U.S. Cl. .............................. 70/496; 70/491; 70/419; 70/495
(58) Field of Search .......................... 70/491, 496, 367, 70/379 R, 380, 422, 218, 419

(56) References Cited

U.S. PATENT DOCUMENTS

| | | | |
|---|---|---|---|
| 2,016,602 A | 10/1935 | Jacobi | |
| 2,068,405 A | 1/1937 | Gerald | |
| 2,096,719 A | 10/1937 | Johnstone | |
| 2,666,322 A | * 1/1954 | Uher | 70/419 |
| 3,287,944 A | 11/1966 | Crumb | |
| 3,410,123 A | 11/1968 | Jacobi | |
| 3,524,335 A | 8/1970 | George | |
| 3,599,455 A | 8/1971 | Pilvet | |
| 3,637,243 A | 1/1972 | Kitano et al. | |
| 3,659,444 A | * 5/1972 | Wellekens | 70/360 |
| 3,739,611 A | 6/1973 | Ignatjev | |
| 3,863,476 A | 2/1975 | Patriquin | |
| 3,928,993 A | 12/1975 | Epstein | |
| 3,968,668 A | 7/1976 | Epstein | |
| 3,992,907 A | 11/1976 | Pilvet | |
| 4,385,510 A | 5/1983 | Harper | |
| 4,750,342 A | * 6/1988 | Nakai | 70/364 R |
| 4,759,204 A | * 7/1988 | Neyret | 70/360 |
| 4,773,240 A | 9/1988 | Foshee | |
| 4,794,772 A | 1/1989 | Falk et al. | |
| 4,903,512 A | 2/1990 | Leroy et al. | |
| 4,936,895 A | 6/1990 | Leclerc et al. | |
| 5,044,183 A | 9/1991 | Neyret | |
| 5,050,410 A | 9/1991 | Claar et al. | |
| 5,060,494 A | 10/1991 | Moorhouse | |
| 5,070,716 A | 12/1991 | Whorlow | |
| 5,216,908 A | 6/1993 | Malvy | |
| 5,263,348 A | * 11/1993 | Wittwer | 70/379 R |
| 5,265,453 A | * 11/1993 | Konii et al. | 70/379 R |
| 5,285,667 A | 2/1994 | Fukasawa et al. | |
| 5,295,376 A | * 3/1994 | Myers | 70/369 |
| 5,295,377 A | 3/1994 | Moricz et al. | |

(List continued on next page.)

Primary Examiner—Robert J. Sandy
Assistant Examiner—André L. Jackson
(74) Attorney, Agent, or Firm—Michael Best & Friedrich LLP

(57) ABSTRACT

A free-wheeling lock assembly includes a case and a drive mechanism which is adapted for coupling to a latching mechanism. The drive mechanism includes a lock barrel supported within the case for rotational and axial movement relative to the case and a driver releasably coupled to the lock barrel but fixed against axial movement. The drive mechanism further includes first and second slidebars supported within the case for axial movement relative to the case. The slidebars are coupled to the lock barrel by tumblers of the lock assembly, and translate the lock barrel axially with respect to the driver, decoupling the driver from the lock barrel in response to rotation of the lock barrel when the tumblers are in a locking position. However, the tumblers permit relative axial movement between the first and second slidebars and the lock barrel when the tumblers are in a releasing position, permitting the lock barrel to rotate the driver for operating the latching mechanism.

36 Claims, 22 Drawing Sheets

U.S. PATENT DOCUMENTS

| | | |
|---|---|---|
| 5,570,599 A | 11/1996 | Konii |
| 5,577,409 A * | 11/1996 | Oyabu et al. ............. 70/379 R |
| 5,640,864 A * | 6/1997 | Miyamoto ................ 70/379 R |
| 5,704,234 A | 1/1998 | Resch |
| 5,732,580 A * | 3/1998 | Garnault et al. .............. 70/422 |
| 5,765,417 A * | 6/1998 | Bolton ........................ 70/495 |
| 5,775,147 A | 7/1998 | Wittwer |
| 5,907,963 A * | 6/1999 | Myers et al. ................. 70/371 |
| 5,911,766 A * | 6/1999 | Lieb et al. .................... 70/422 |
| 6,058,751 A | 5/2000 | Dimig et al. |

* cited by examiner

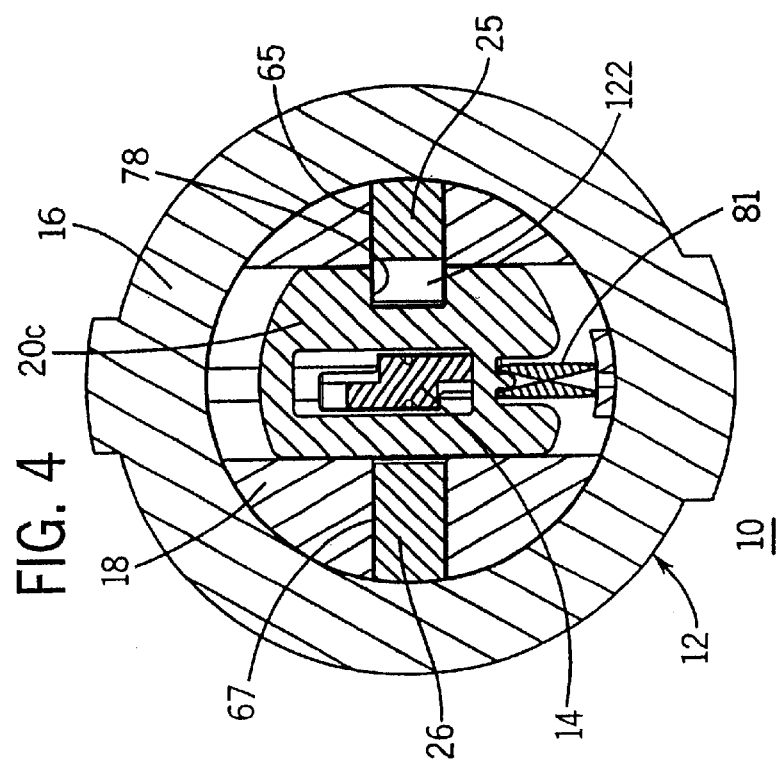
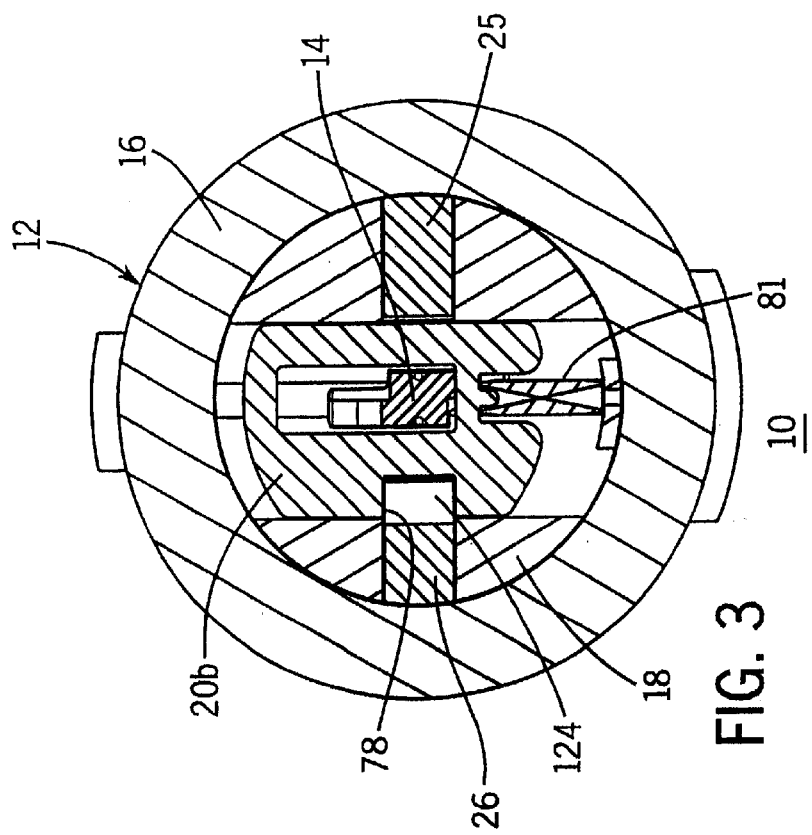

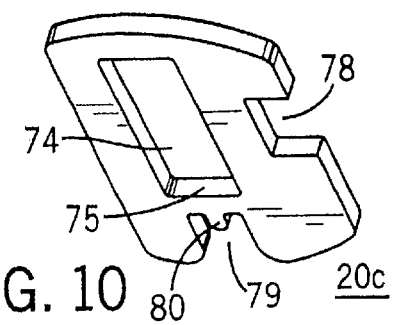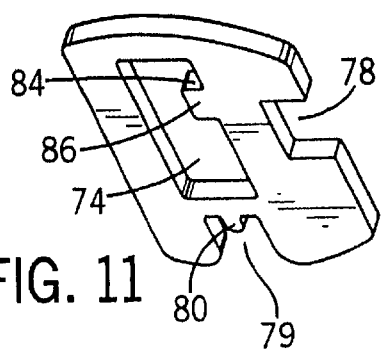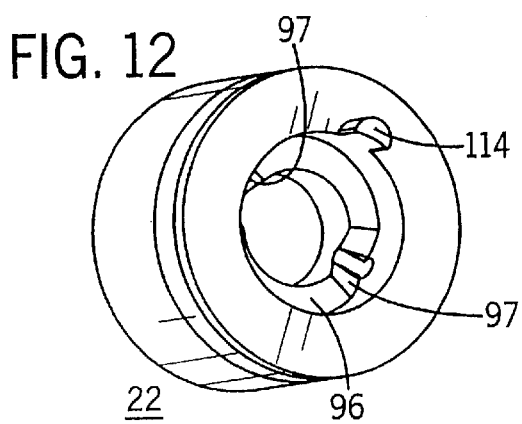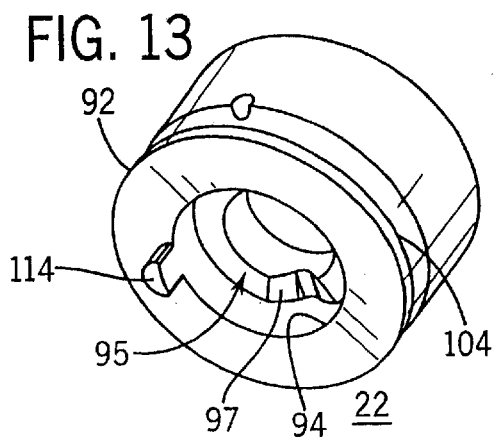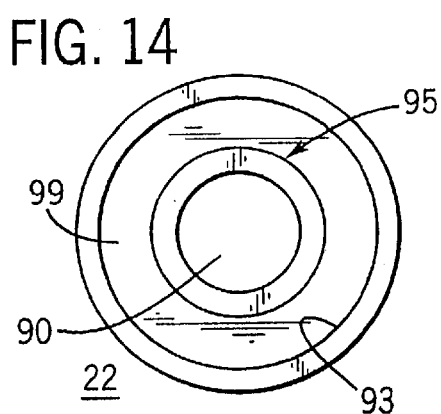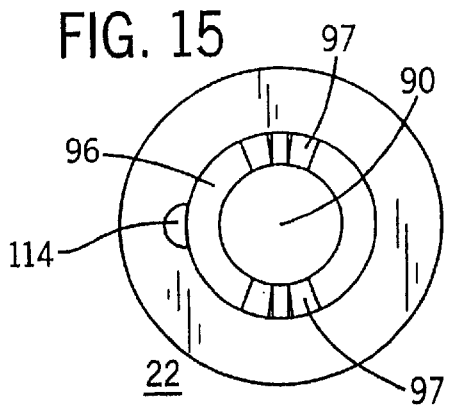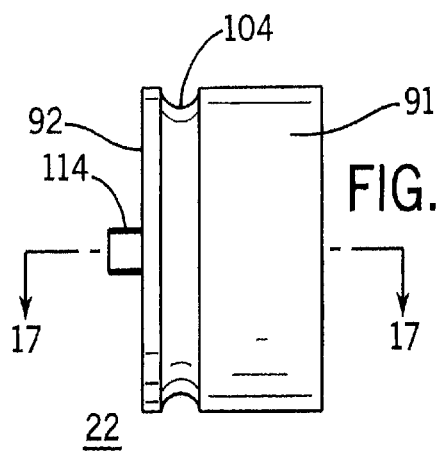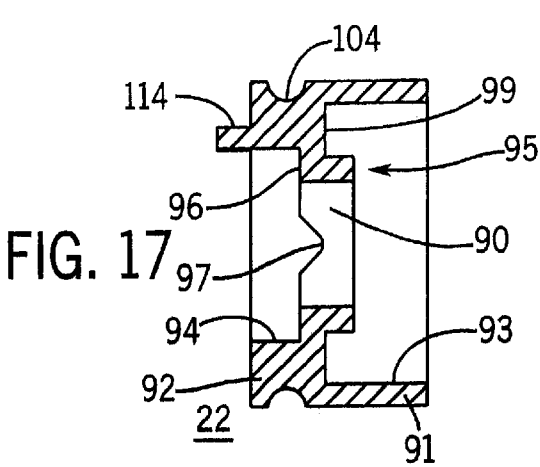

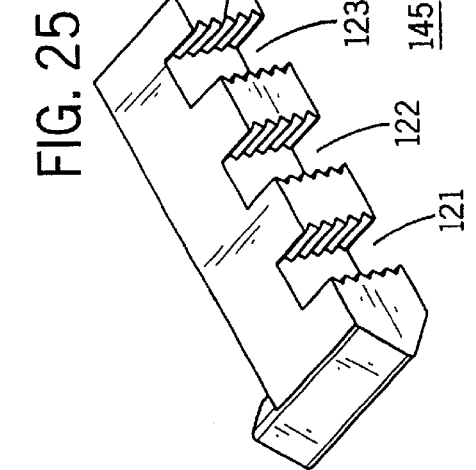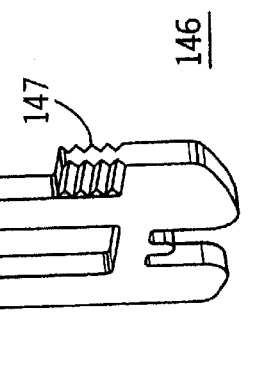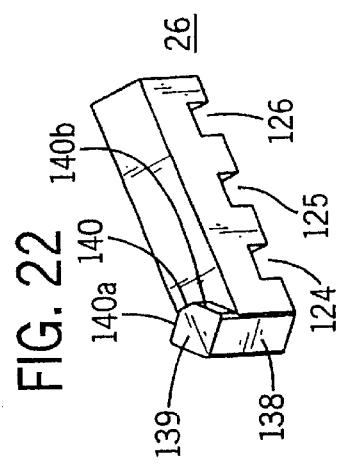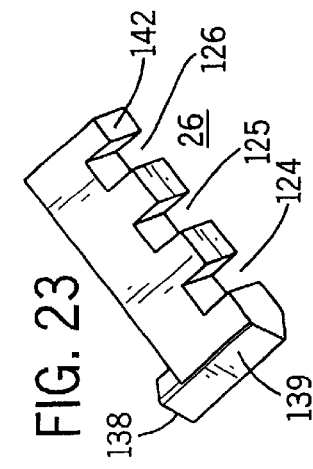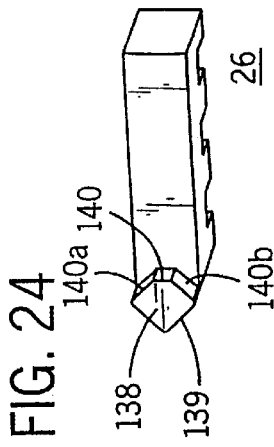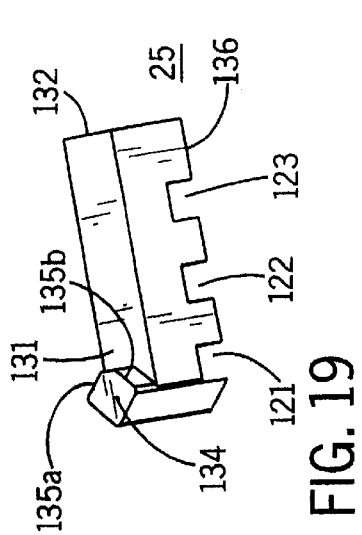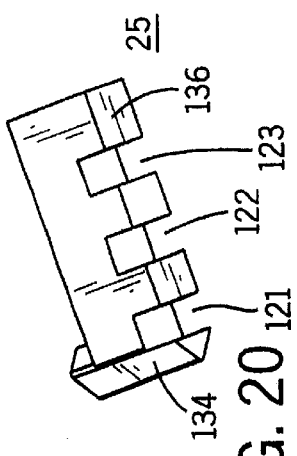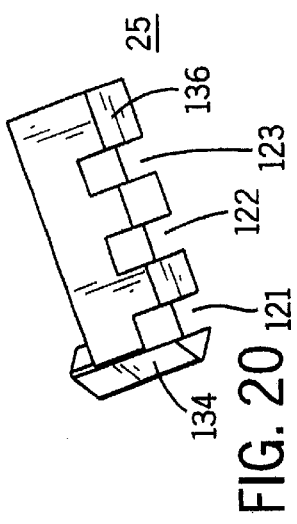

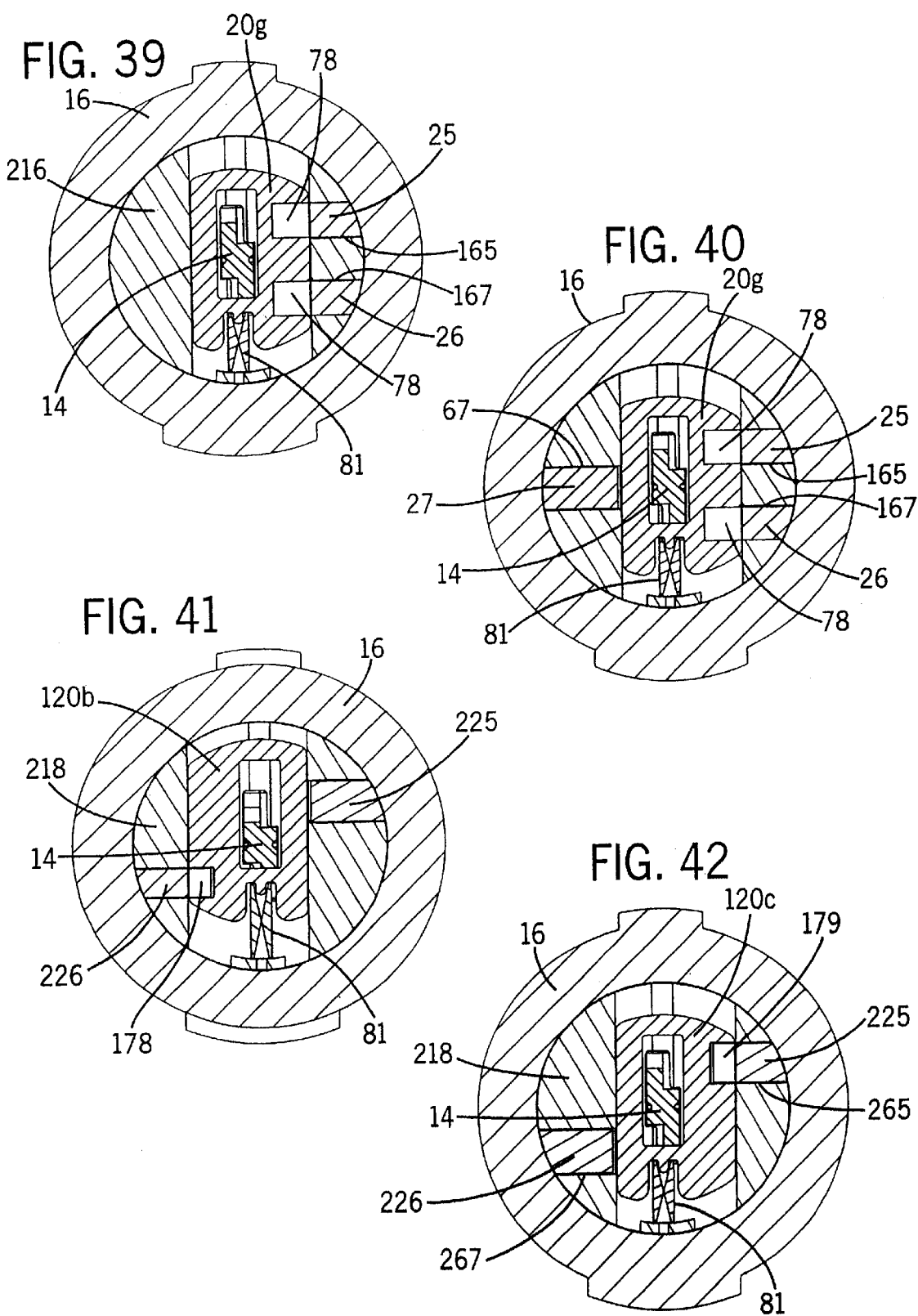

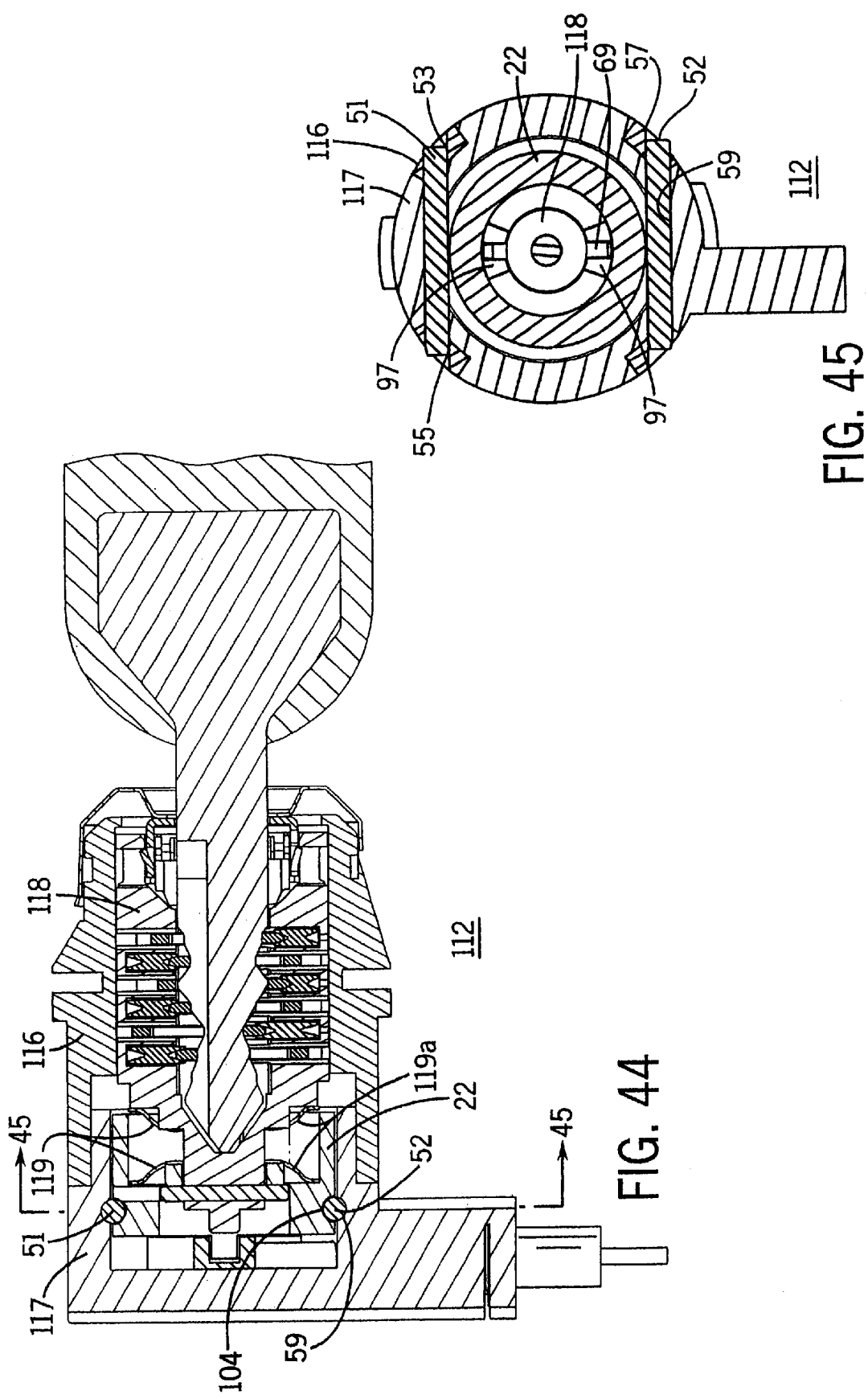

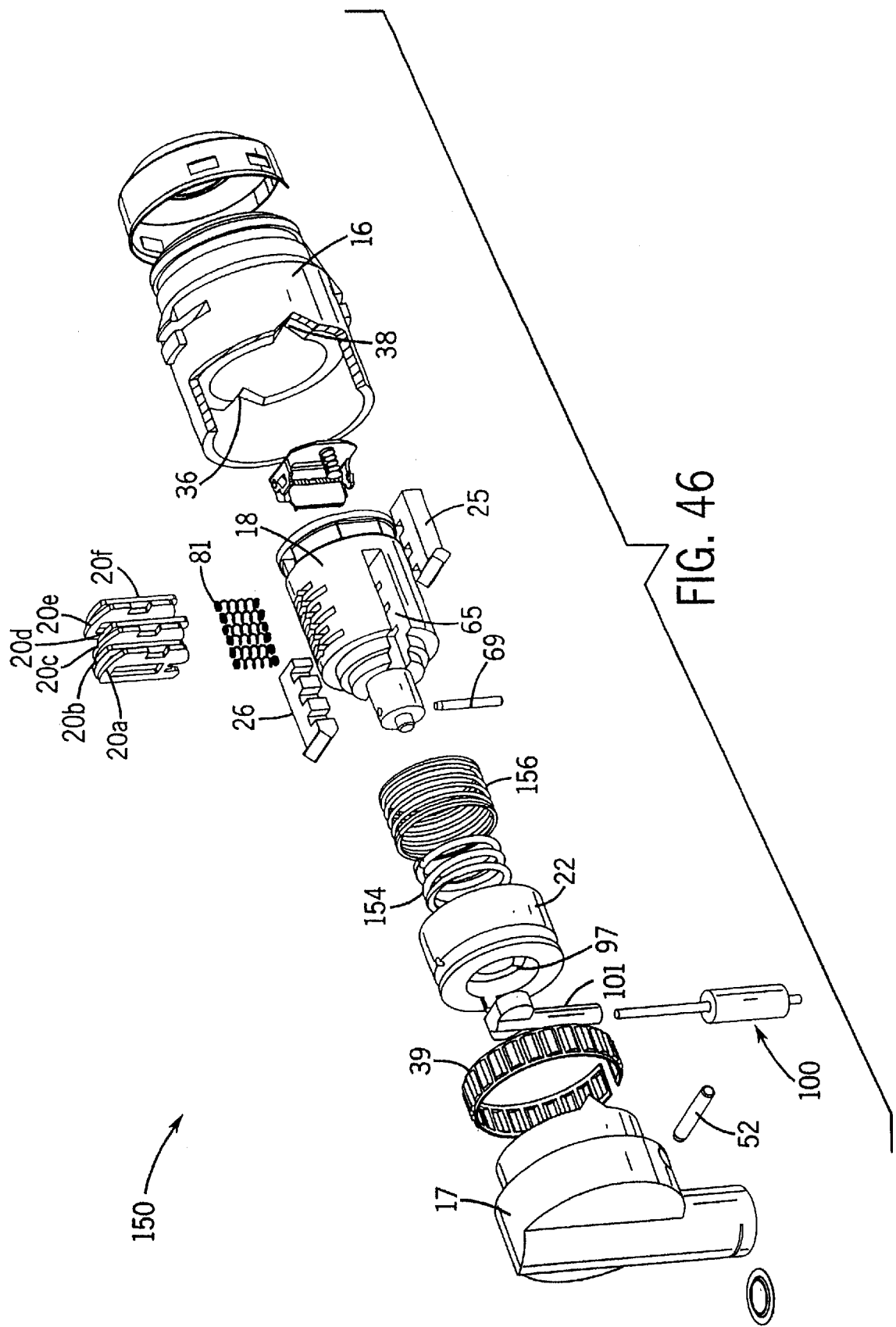

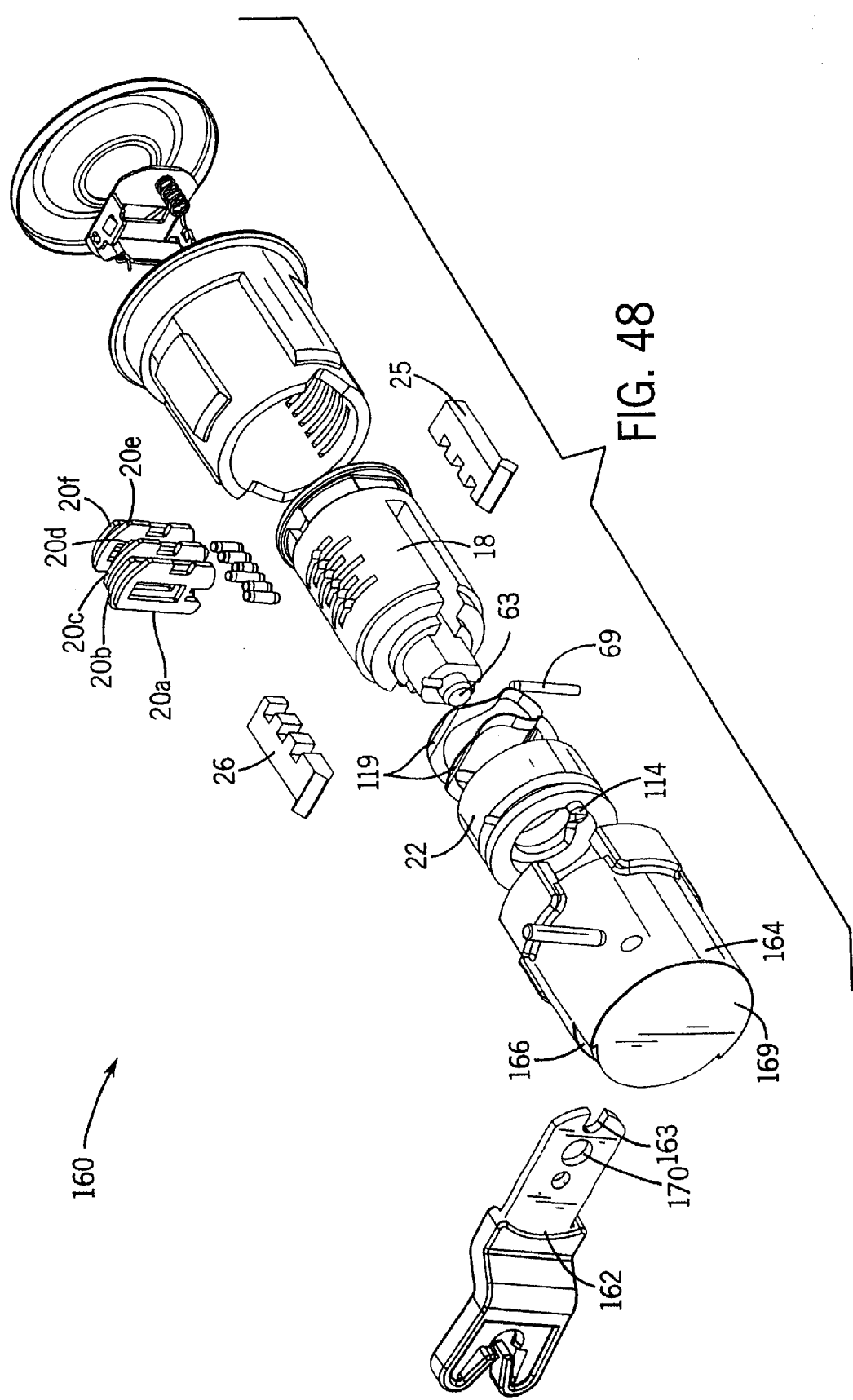

FREE WHEELING LOCK ASSEMBLY

This application is a continuation in part of application Ser. No. 09/566,837, filed May 8, 2000, which is a continuation of application Ser. No. 09/149,334, filed Sep. 8, 1998, now U.S. Pat. No. 6,058,751.

BACKGROUND OF THE INVENTION

Field of the Invention

This invention relates to lock and key sets, and more particularly, to a lock and key set including a tamper resistant, free-wheeling type lock assembly.

The purpose of a free-wheeling type lock is well known in the industry and various designs can be seen in the marketplace The construction of a free-wheeling type lock prevents the lock from being over-torqued during an attack by allowing the lock cylinder to de-clutch from the driving mechanism of the lock when an improper key, screwdriver or other device is used to turn the lock cylinder. To reset the lock, the cylinder is rotated back to a key-out position where the lock cylinder is again coupled to the driving mechanism. Although many concepts have been explored in the past, most free-wheeling locks have been costly and complicated to produce or have proven to be unreliable. Many designs are bulky in size or require multiple motions of the key, including various push in and turn sequences, to actuate their drive mechanisms.

Typically, free-wheeling type locks include a spring-loaded detent to achieve the clutching action between the moving parts of the lock. However, the use of a spring-actuated motion to move the internal mechanisms results in a non-positive motion that is subject to timing restraints.

To accommodate the multiple motion key sequences, known free-wheeling locks provide for axial displacement of the cylinder and/or the sleeve. The displacement is usually against the force of a spring bias to allow the cylinder and/or the sleeve to be returned to the key-out position when torque or axial motion on the key is released. However, the requirement for spring bias and additional motion can make the lock complicated to use.

SUMMARY OF THE INVENTION

The present invention provides a lock and key set including a free-wheeling lock assembly which is compact in size and requires few components. The lock assembly comprises a case, a lock barrel and a driver which is coupled to a latching mechanism which is operated by the free-wheeling lock assembly. The lock barrel is supported within the case for rotational and axial movement relative to the case. Tumblers of the lock assembly are operable between locking and releasing positions as a function of the presence and absence of a mating key in the key slot. In accordance with the free-wheeling aspect of the lock assembly, the lock barrel can be rotated relative to the case whether or not the mating key is present in the key slot.

Rotation of the lock barrel when the tumblers are in the releasing position causes the driver to rotate, operating the latching mechanism between the locked and unlocked conditions. However, the lock barrel is releaseably coupled to the driver so that when the tumblers are in the locking position, rotation of the lock barrel causes the lock barrel to become decoupled from the driver and rotation of the lock barrel is ineffective to cause the driver to operate the latching mechanism.

To this end, the lock assembly includes a translation mechanism which is coupled between the case and the lock barrel. The translation mechanism translates the lock barrel axially relative to the case in response to rotation of the lock barrel in the absence of the mating key in the key slot. This releases the coupling mechanism, permitting relative rotational movement between the lock barrel and the driver.

In one embodiment, the translation mechanism comprises first and second slidebars which are supported within the case for at least axial movement relative to the case. The tumblers cooperate with the slidebars to prevent relative axial movement between the slidebars and the lock barrel when the tumblers are in the locking position. However, the slidebars are movable axially relative to the lock barrel when the tumblers are in the releasing position.

When the tumblers are in the locking position, a portion of each tumbler extends into the corresponding mating notch in the first or second slidebar, preventing relative axial motion between the lock barrel and the slidebars. For this condition, if the barrel is rotated by some means, such as a screwdriver, the lock barrel will axially translate with respect to the case as the first and second slidebars follow the internal cam surfaces of the case causing the lock barrel to disengage from the driver. If a wrong key is present in the key slot and the lock barrel is rotated, all tumblers will not be in the releasing position and at least a portion of at least one tumbler extending into the mating notch in the first or second slidebar will cause the lock barrel to axially translate with respect to the case as the first and second slidebars are following the internal cam surfaces of the case, causing the lock barrel to disengage from the driver.

In accordance with another aspect of the invention, the axial translation of the lock barrel relative to the case results in preventing displacement of an actuator mechanism that is coupled to the latching mechanism. This prevents the latching mechanism from being operated during an attempt at compromising the lock assembly. In one embodiment, in which the coupling mechanism between the lock barrel and the latching mechanism includes a linearly movable actuator, a projection on the lock barrel engages the actuator to prevent linear movement of the actuator. In another embodiment, in which the coupling mechanism between the lock barrel and the latching mechanism includes a lever, a projection on the lock barrel engages the lever to prevent pivoting of the lever.

DESCRIPTION OF THE DRAWINGS

These and other advantages of the present invention are best understood with reference to the drawings, in which:

FIG. 3 is a vertical section view of the lock and key set taken along the line 3—3 of FIG. 1;

FIG. 4 is a vertical section view of the lock and key set taken along the line 4—4 in FIG. 1;

FIG. 10 is an isometric view of a tumbler of the lock assembly of FIG. 1;

FIG. 11 is an isometric view of a tumbler for a side-milled key;

FIG. 12 is a rear isometric view of a driver of the lock assembly FIG. 1 showing a V-groove thereof;

FIG. 13 is a rear isometric view of the driver of the lock assembly FIG. 1, with the driver rotated to show another V-groove thereof;

FIG. 14 is a front elevation view of the driver of the lock assembly FIG. 1;

FIG. 15 is a rear elevation view of the driver of the lock assembly FIG. 1;

FIG. 16 is a side elevation view of the driver of the lock assembly FIG. 1;

FIG. 17 is a transverse section view of the driver taken along the line 17—17 of FIG. 16;

FIGS. 19, 20 and 21 are isometric views of one slidebar of the lock assembly of FIG. 1;

FIGS. 22, 23 and 24 are isometric views of another slidebar of the lock assembly of FIG. 1;

FIG. 25 is an isometric view of a further embodiment of a slidebar for the lock assembly of FIG. 1;

FIG. 26 is an isometric view of a tumbler for a lock assembly incorporating the slidebar of FIG. 25;

FIG. 39 is a view similar to that of FIG. 4 for another embodiment of a lock and key set in which the slidebars are located on the same side of the lock barrel;

FIG. 40 is a view similar to that of FIG. 39 for a further embodiment of a lock and key set which includes a further slidebar on the opposite side of the lock barrel;

FIG. 41 is a view similar to that of FIG. 3 for a further embodiment of a lock and key set in which the slidebars are offset vertically;

FIG. 42 is a view similar to that of FIG. 4 for the lock and key set of FIG. 41;

FIG. 44 is a vertical section view of the lock and key set of FIG. 43;

FIG. 45 is a section view taken along the line 45—45 of FIG. 44;

FIG. 46 is an exploded isometric view of a further embodiment of a lock and key set provided by the invention;

FIG. 48 is an exploded isometric view of another embodiment of a lock and key set provided by the invention;

DETAILED DESCRIPTION OF THE PREFERRED EMBODIMENTS

Figure 1:
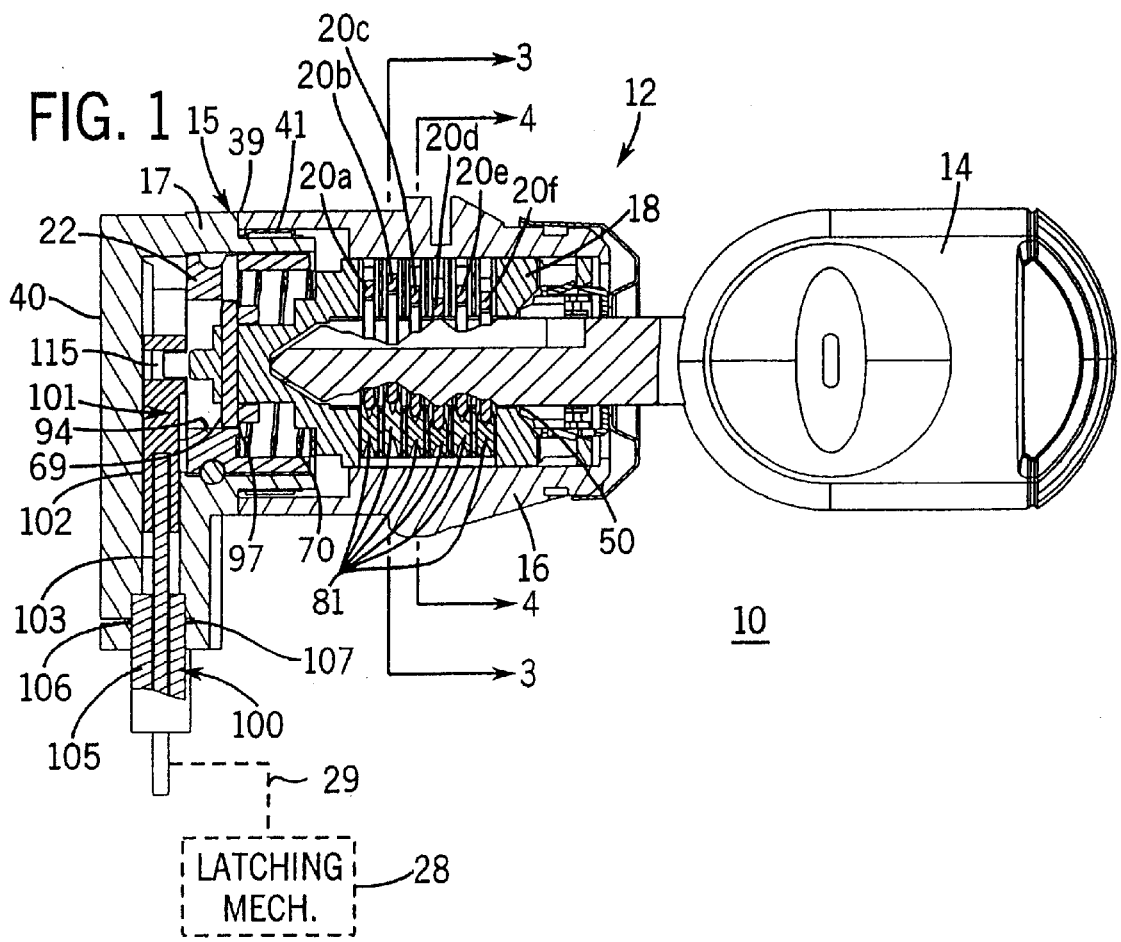
FIG. 1 is a vertical section view of a lock and key set including a free-wheeling lock assembly in accordance with the invention, and with the mating key in the lock barrel.
Figure 2:
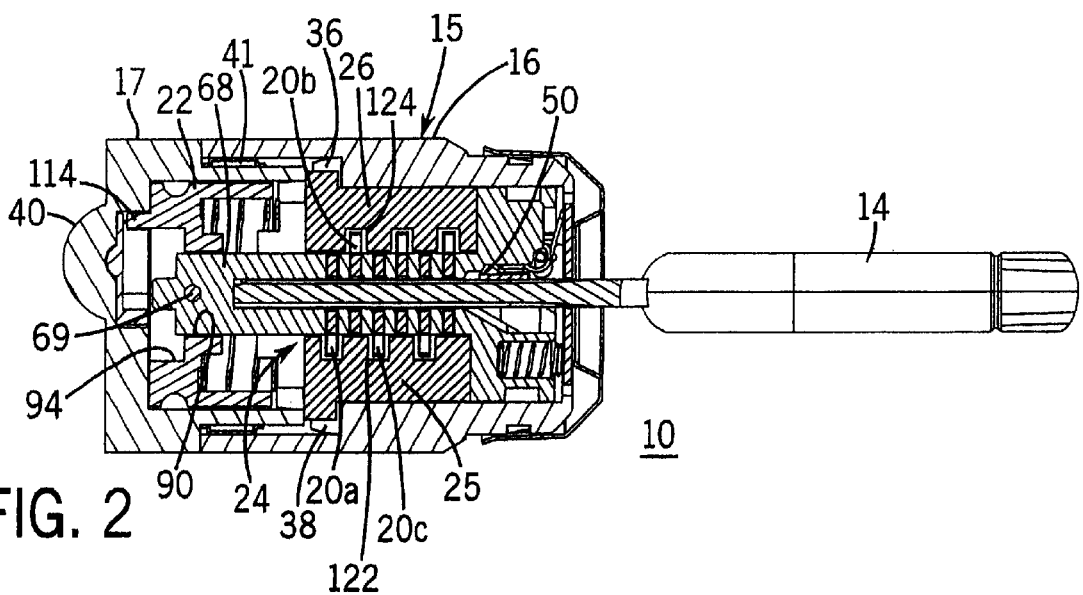
FIG. 2 is a transverse section view of the lock and key set of FIG. 1.

Referring to FIGS. 1–5 of the drawings, there is illustrated one embodiment of a lock and key set 10 provided in accordance with the invention. The lock and key set 10 includes a free-wheeling lock assembly 12 and a key 14. In one embodiment, the free-wheeling lock assembly 12 includes four major components, namely, a case 15, a lock barrel 18, a driver 22, and a translation mechanism 24 (FIG. 2). In one embodiment, the translation mechanism 24 include slidebars 25 and 26.

By way of illustration, the lock and key set 10 is described with reference to an application for locking and unlocking a door, a deck lid, or the like, of a motor vehicle. The driver 22 is coupled by a suitable linkage or other rotary or linear actuating mechanism to a latching mechanism 28 (FIG. 1) associated with a door, a deck lid, or the like, of the motor vehicle.

While in a preferred embodiment, the lock and key set 10 is described with reference to application for a vehicle lock, the lock and key set can be used in other applications. Also, although the lock assembly 12 is shown coupled to the latching mechanism 28 by a linkage, the latching mechanism 28 can be directly connected to the lock assembly by coupling directly to the driver 22. One example of this would include a shaft integral to the driver 22, which extends through the back of the case 15. Another example is providing gear teeth on the periphery of the driver 22 and providing a gear driving a rod or rotary linkage.

Case

Considering the lock assembly in more detail, with reference to FIGS. 1, 2, 5, 6 and 7, in one embodiment, the case 15 is a two part component which includes a stationary sleeve 16 and a sleeve end 17.

The sleeve 16 is generally tubular in shape and has a cylindrical bore 30 for rotatably receiving and permitting limited axial travel of the lock barrel 18. The bore 30 includes a forward portion 31 and a rearward portion 32 which has an inner diameter that is larger than the inner diameter of the forward portion 31. The front end 33 of the sleeve includes an inwardly projecting peripheral lip 34 which prevents the lock barrel 18 from being forcibly removed by slam-pulling. The sleeve 16 includes an internal annular cam surface 35 which provides axial translation of the slidebars 25 and 26 relative to the sleeve in response to rotation of the lock barrel as will be described. In one embodiment, the cam surface includes V-shaped portions 36 and 38 at diametrically opposed locations.

Figure 7:
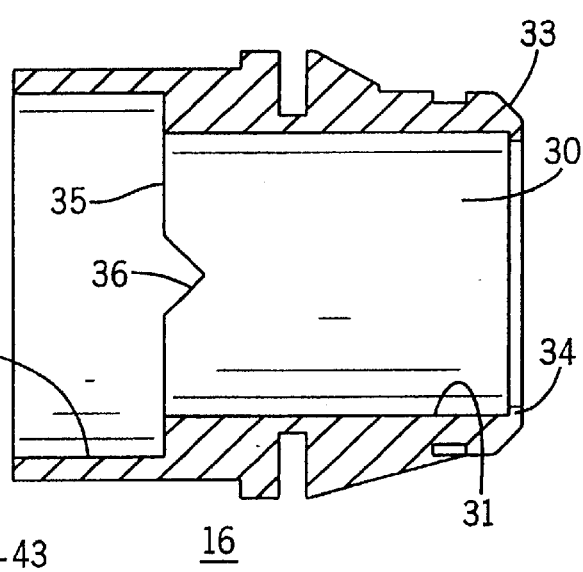
FIG. 7 is a side section view of the sleeve of FIG. 6.
Figure 7A:
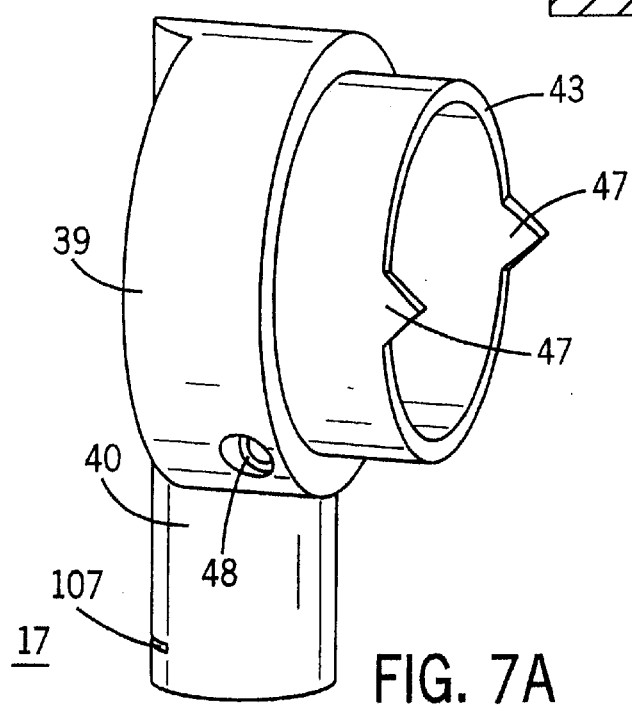
FIG. 7A is an isometric view of the sleeve end of the case.

Referring to FIG. 7A, the sleeve end 17 includes an annular cap-like body portion 39 and a tubular portion 40 which extends downwardly from the body portion 39. The sleeve end 17 further includes an annular cam surface 43, opposing cam surface 35 of the sleeve 16. The cam surface 43 provides return axial translation of the slidebars 25 and 26 relative to the barrel when all tumblers are in the releasing position and the lock barrel 18 is rotated back to the key out position. In one embodiment, the cam surface 43 includes V-shaped projections 47 at diametrically opposed locations, opposing the V-shaped portions 36 and 38 of the sleeve 16.

The rearward portion 32 of the sleeve 16 is adapted to receive and be secured to the sleeve end 17. In one embodiment, the sleeve 16 and the sleeve end 17 are securely joined together with a tolerance ring 41 which provides a controlled interference fit between the sleeve 16 and the sleeve end 17. The body portion 39 of the sleeve end 17 includes a transverse opening 48 which receives a coupling element, such as a dowel pin 49 for a purpose to be shown. The outer surface of the sleeve 16 is adapted for mounting the lock assembly 10 on a surface of a vehicle, such as a surface of a door, deck lid, etc.

Lock Barrel

Referring now to FIGS. 1, 2, 5, 8 and 9, the lock barrel 18 is a solid, generally cylindrical member including a sidewall 42 which is dimensioned to be received within the smaller diameter forward portion 31 of the sleeve 16. The lock barrel 18 includes a forward portion 44, an intermediate portion 45 and a rearward portion 46 The forward portion 44 of the lock barrel 18 includes an opening which defines the key slot 50 for the lock assembly.

Figure 8:
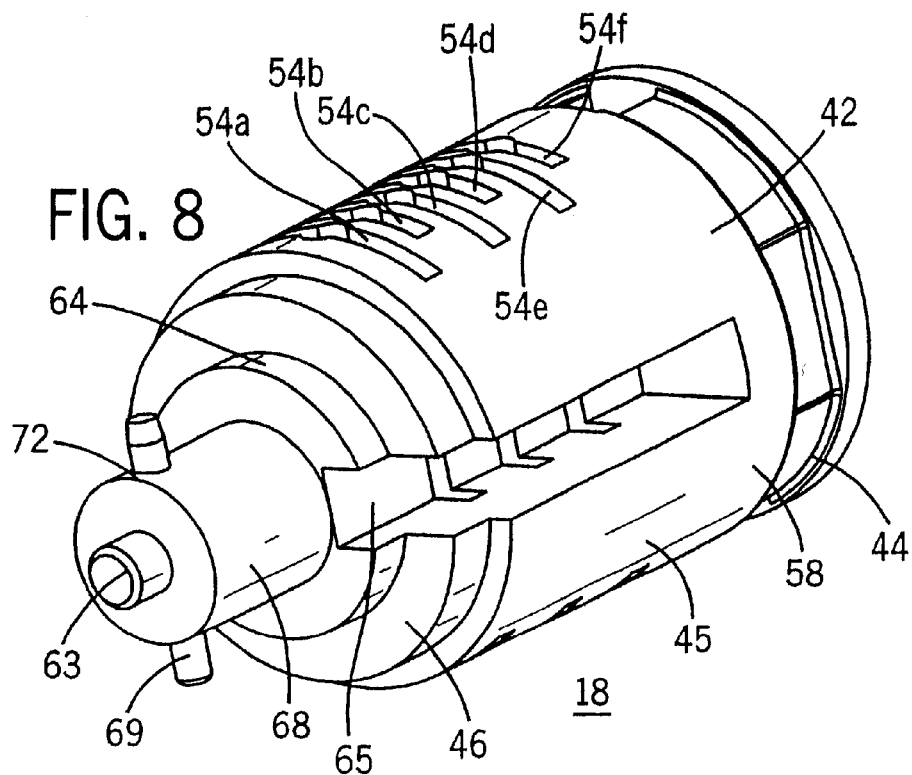
FIG. 8 is an isometric view showing one side of a lock barrel of the free-wheeling lock assembly of FIG. 1.
Figure 9:
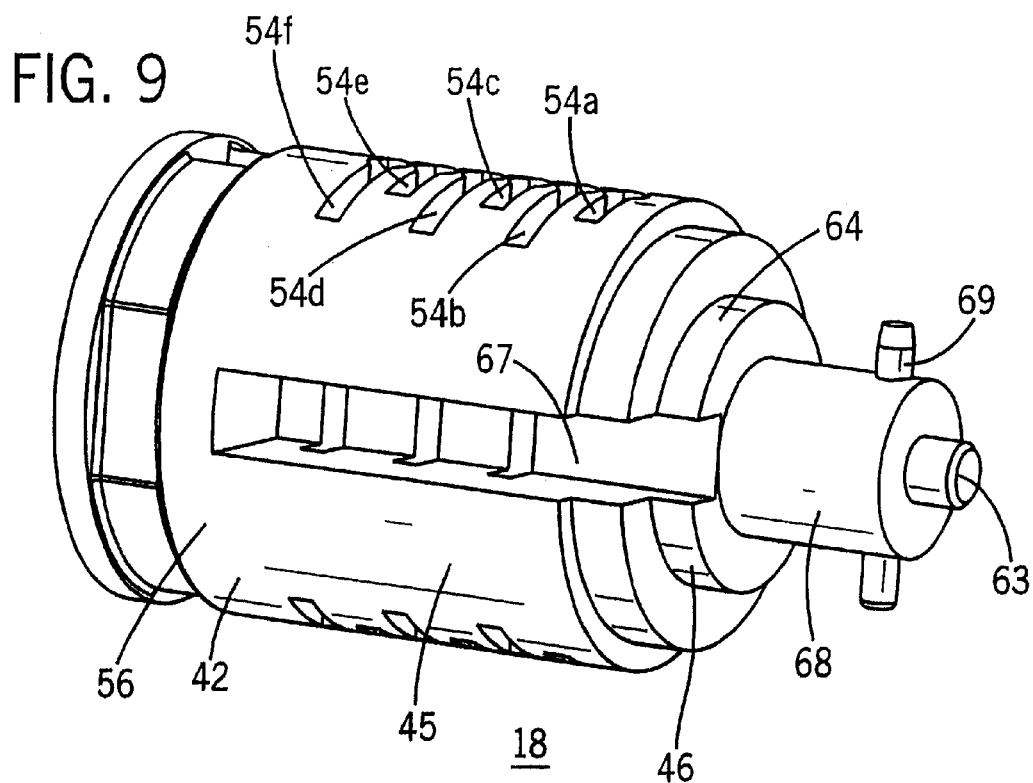
FIG. 9 is an isometric view showing the other side of the lock barrel of FIG. 8.

Referring also to FIGS. 8 and 9, the intermediate portion 45 of the lock barrel 18 includes a plurality of tumbler wards 54a–54f which extend between the cylindrical sides 56 and 58 of the lock cylinder 18 and which receive tumblers 20a–20f (FIG. 1). In one embodiment, the tumbler wards are offset, alternately, with respect to the centerline of the lock barrel. This locates alternate tumblers at opposite sides of the lock barrel. The tumbler wards 54a–54f allow movement of the tumblers 20a–20f generally perpendicular to the axis of the lock barrel 18 as the key 14 is being inserted into or removed from the lock.

Referring to FIGS. 8 and 9, the rearward portion 46 of the lock barrel 18 has a reduced diameter relative to the intermediate portion 45 of the lock barrel 18, defining a shoulder 64. The rearward portion 46 of the lock barrel 18 further defines a shaft 68 having a pair of radial projections at diametrically opposed locations along the circumference of the shaft 68. The shaft has a reduced diameter tip 63. In one embodiment shown in FIG. 5, for example, the projections are defined by a pin 69. The pin 69 extends through an opening 72 through the shaft near the end of the shaft 68. The pin 69 is fixed to the shaft 68 of the lock barrel.

The lock barrel 18 includes two slidebar slots 65 and 67, shown in FIGS. 8 and 9, respectively, for receiving the slidebars 25 and 26, respectively, of the translation mechanism 24 as shown in FIG. 4, for example. In one embodiment, the tumbler wards 54a–54f are alternately offset along the barrel axis so that half of the tumbler wards, such as tumbler wards 54a, 54c, and 54e communicate with the slidebar slot 65 as shown in FIG. 8, and the remaining tumbler wards 54b, 54d and 54f communicate with the other slidebar slot 67 as shown in FIG. 9.

Referring to FIG. 39, which is similar to FIG. 4, in a further embodiment, the slidebars 25 and 26 can be located on the same side of a lock barrel 216, spaced apart vertically. Slidebar slots 165 and 167, corresponding to slidebar slots 65 and 67, are provided on the same side of lock barrel 216. This embodiment employs modified tumblers, such as a tumbler 20g, which are oriented with a pair of notches 78 in communication with the slidebar slots 165 and 167 in the lock barrel 216. Also, the lock can include a further slidebar 27 located in a slidebar slot 67 on the opposite side as shown in FIG. 40.

Referring to FIGS. 41 and 42, which are similar to FIGS. 3 and 4, respectively, in another embodiment, the slidebars 225 and 226 can be offset vertically, with respect to the center of lock barrel 218. For example, in this embodiment, the notch 178 in tumbler 120b is located near the lower edge of the tumbler and notch 179 in tumbler 120c is located near the upper edge of the tumbler 120c. The locations of the slidebar slots 265 and 267, and thus the positioning of the slidebars 225 and 226, also are shifted vertically.

Tumbler

Referring to FIGS. 1, 4, 5 and 10 in one embodiment, each tumbler, such as tumbler 20c, is generally rectangular in shape and has a substantially rectangular opening 74 therethrough to accept an edgecut key. The opening 74 can be located generally centrally of the tumbler. Tumbler 20c includes a tumbler engaging or key mating surface 75 within the opening 74 which cooperates with the coded notches 76 and 77 of the key 14, FIG. 5, for activating the tumbler 20c, with the cooperation of a resilient biasing element 81, both up and down during insertion or removal of the key. Tumblers 20a, 20b and 20d–20f are generally similar to tumbler 20c include the slidebar disengaging notch at unique vertical locations with respect to the key mating surface 75.

Each of the tumblers 20a–20f, such as tumbler 20c, includes a notch 78 in one side thereof. The notch 78 is codeably spaced vertically along one side with respect to the key mating surface and different tumblers can have the notch 78 at different locations along the length of the tumbler. The tumbler bottom edge includes a notch 79 with a center support nib 80 which locates a tumbler bias element 81, such as a spring as shown in FIG. 4 or some type of elastomeric element.

Referring also to FIGS. 27, 28, 29 and 30, which illustrate the lock assembly 10 in a key out condition, tumblers 20a, 20b, 20c, 20d, 20e and 20f are located in tumbler wards 54a, 54b, 54c, 54d, 54e, and 54f, respectively, within the lock barrel 18. The tumblers are biased radially outward by tumbler bias elements 81 and are movable inwardly against the force of the tumbler bias elements 81 by the mating key in the known manner when the mating key is inserted into the key slot 50. Unless the mating key is present in the key slot, the tumblers extend into each corresponding notched opening along the longitudinal length of the slidebars 25 and 26 and thus, in multiplicity, preventing relative axial motion between the lock barrel 18 and the slidebars 25 and 26.

Referring to FIG. 11, in an alternate embodiment for a tumbler for use with a lock and key set including a side-milled key, the mating key surface can be defined by an upper surface 84 of a protrusion 86 which is engaged by the coded surface of a side milled key (not shown).

Driver

Referring to FIGS. 5 and 12–17, the driver 22 preferably is generally annular in shape and has a through bore 90 from the forward end 91 to the rearward end 92 of the driver.

The throughbore 90 is countersunk both at the forward end 91 and the rearward end 92, defining enlarged diameter portions 93 and 94, respectively. The driver 22 includes a recessed hub 95 which is located near the center of the driver, intermediate the enlarged diameter portions 93 and 94. The hub 95 is spaced from the inner wall of the enlarged diameter forward portion of the throughbore 90, defining an inner annular groove or channel 99. The inner diameter of the portion of the throughbore 90 through the hub 95 is slightly greater than the outer diameter of the shaft portion 68 of the lock barrel 18 (FIG. 9) which is received in and supported by the hub 95.

Figure 31:
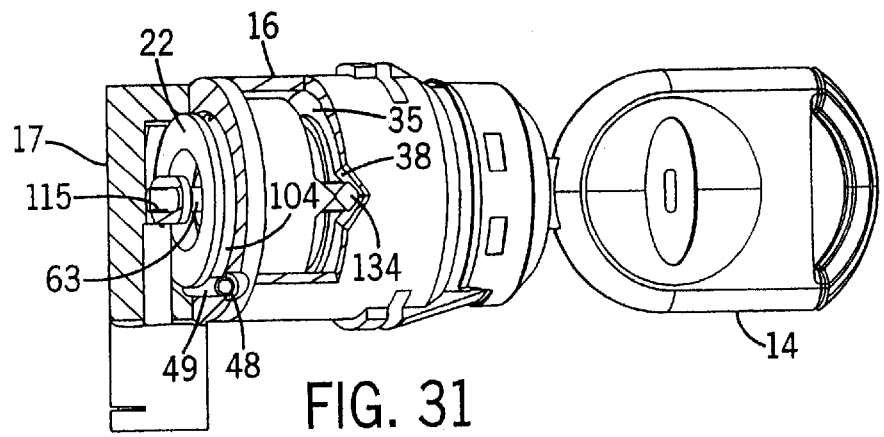
FIG. 31 is an isometric view of the lock and key set of FIG. 1, partially broken away, and with the tolerance ring removed, to show the cam mechanism.

The rearward facing surface 96 of the hub 95 defines a detent surface which cooperates with the pin 69 (FIGS. 1 and 8) carried by the shaft portion 68 of the lock barrel 18 to provide a releasable clutch mechanism which releasably couples the driver 22 to the lock barrel 18. In one embodiment, the surface 96 of the hub 95 includes a pair of V-grooves 97 at diametrically opposed locations along the periphery of the hub 95. The V-grooves 97 are sized to receive the ends of the pin 69 when the lock barrel 18 is in the key-out position, shown in FIG. 27, for example. The driver 22 further includes a projection or protrusion 114 for a purpose to be described. The driver 22 has a circumferential groove 104 in its outer surface, near the rearward end of the driver. Groove 104 is juxtaposed with the transverse opening 48 through the sleeve end 17. The dowel pin 49 is received in defined by the opening 48 and the groove 104 and couples the driver 22 to the case as shown in FIG. 31, for example, preventing axial movement of the driver 22 relative to the case.

Figure 27:
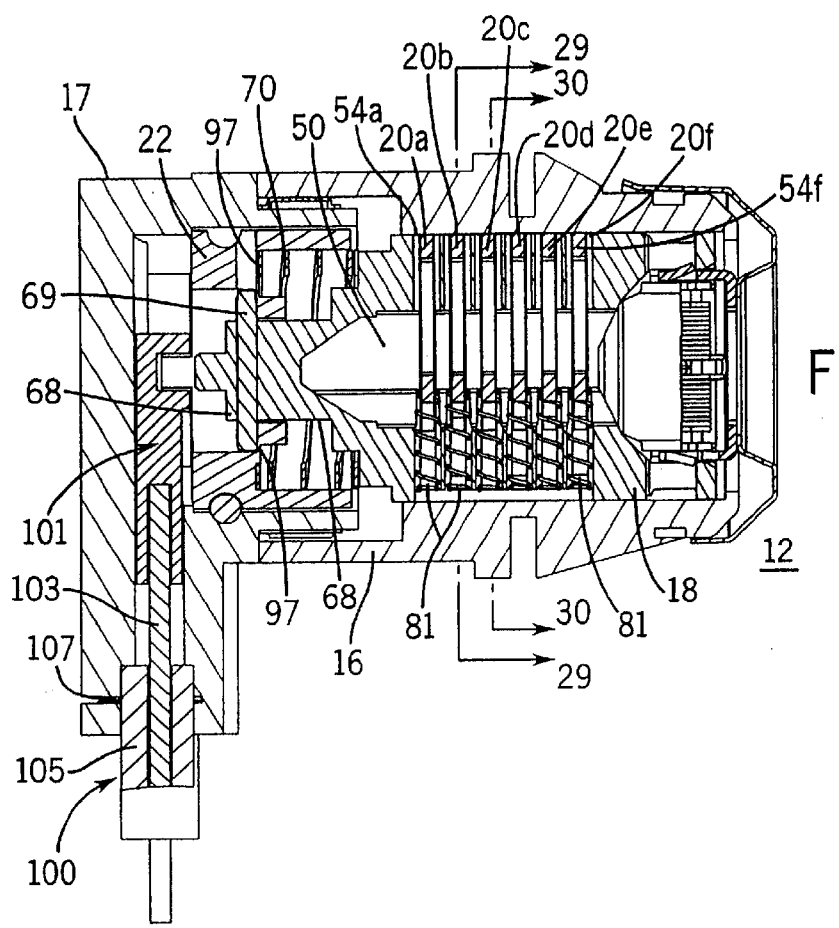
FIGS. 27 and 28 are views similar to those of FIGS. 1 and 2, respectively, and with the key removed.
Figure 28:
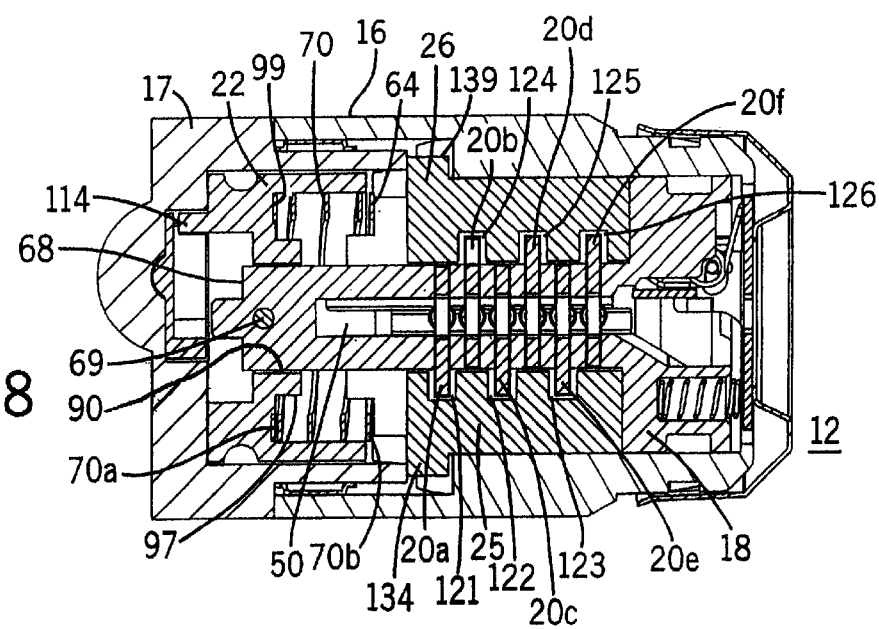

Referring also to FIGS. 27 and 28 in which the lock barrel 18 is shown for the key-out condition, the driver 22 is located within the sleeve 16 and sleeve end 17 adjacent to the rearward end of the lock barrel 18 with the shaft portion 68 of the lock barrel 18 passing through the throughbore 90. As shown in FIG. 27, for example, the pin 69 is located within the V-grooves 97 when the lock barrel is in the key-out position.

Figure 5:
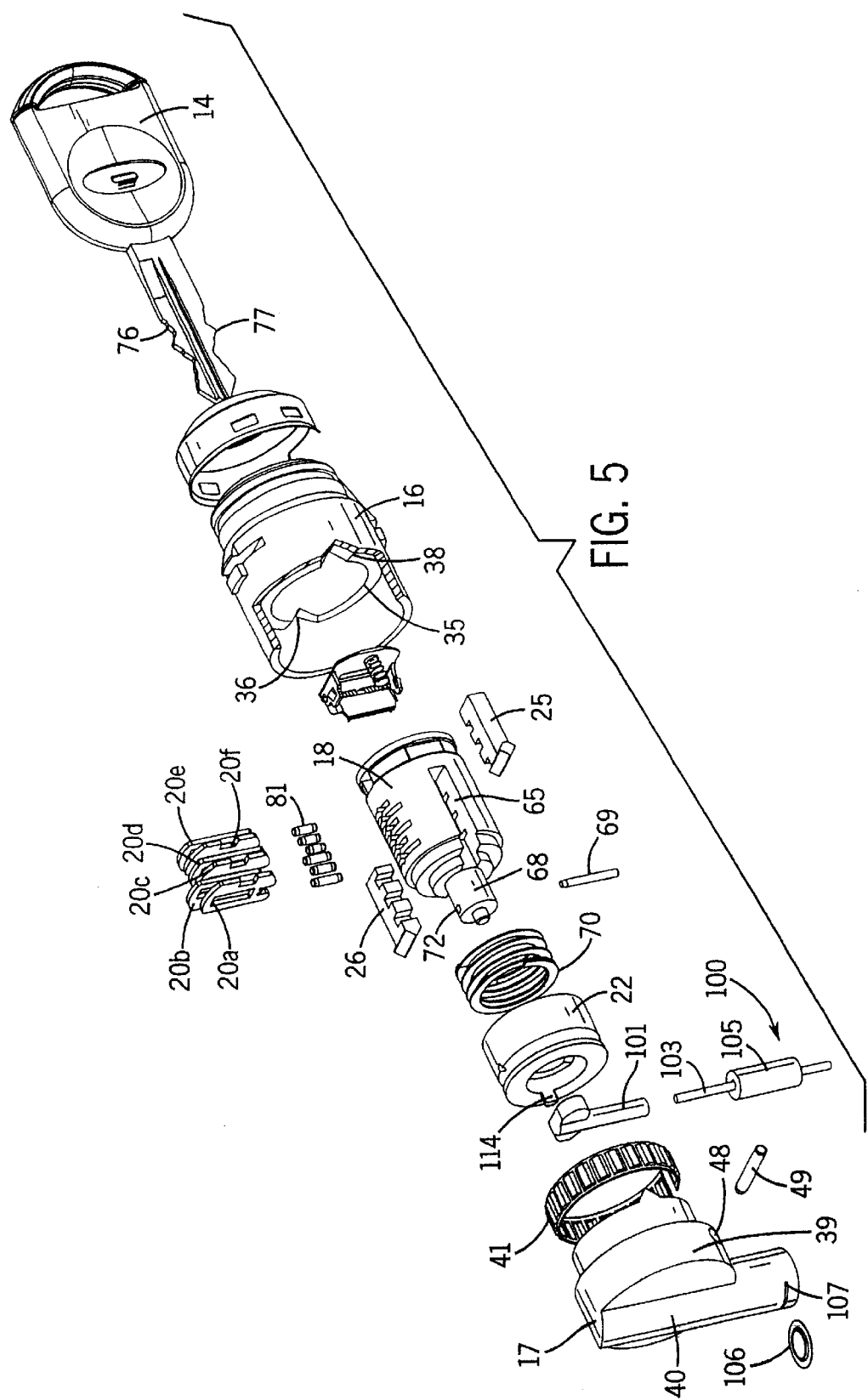
FIG. 5 is an exploded isometric view of the lock and key set of FIG. 1.

The lock barrel 18 is biased into engagement with the driver 22 by bias structure 70 which, in one embodiment, comprises a flat wire compression spring shown in FIG. 5. One end 70a of the bias spring 70 is seated in the annular channel 99 of the driver 22 as shown in FIG. 28, for example. The shoulder 64 of the lock barrel 18 provides an annular support surface (FIG. 8) for the other end 70b of the bias spring 70. The bias spring 70 acts upon the driver 22 and lock barrel 18 with an axial separating force. Although lock assembly 12 includes a flat wire compression spring for providing axial separation biasing between the driver and the lock barrel, it is apparent that other biasing means, including resilient, compressible material, vacuum, air pressure, rubber, magnets, etc. or other types of bias elements, such as Crest-to-Crest plain end wave springs, squared-shim end wave springs, or one or more flat springs, can be used.

The lock barrel 18 and the driver 22 form a drive mechanism for the free-wheeling lock assembly 12. The detent surface 96, the pin 69 and the bias spring 70 form a spring biased clutch mechanism which releaseably maintains the lock barrel 18 in engagement with the driver 22, permitting the driver 22 to be rotated with the lock barrel 18 when the coded key 14 is inserted into the key slot and turned. The enlarged diameter portion 94 of the throughbore 90 allows the pin 69 to be rotated relative to the driver and to be translated axially with respect to the driver. The surfaces of the V-grooves 97 provide cam surfaces for the ends of the pin 69, allowing the pin 69 to be moved out of the V-grooves 97 in response to relative rotation between the driver 22 and the lock barrel 18.

Figure 18:
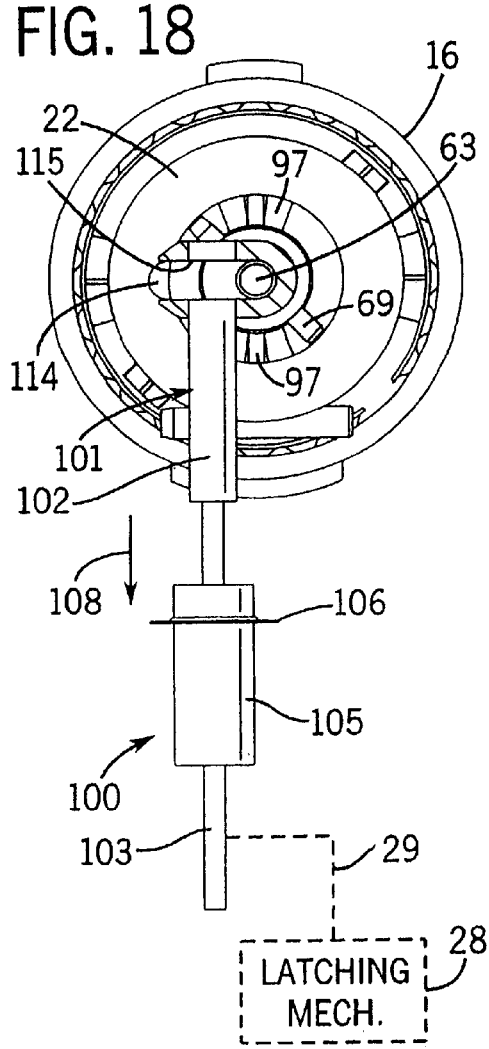
FIG. 18 is a rear elevation view of the lock and key set of FIG. 1 with the sleeve end removed, showing the coupling between the driver and the cable actuator when the lock barrel is rotated with the wrong key.

Reference is now made to FIG. 1 and to FIG. 18. FIG. 18 is a rear elevation view of the lock and key set of FIG. 1 with the sleeve end removed, showing the coupling between the driver and the cable actuator when the lock barrel is rotated with a wrong key. The drive mechanism can be coupled by a suitable linkage or other rotary or linear actuating mechanism, such as a cable 100, illustrated in FIG. 18, for example, to the latching mechanism 28 associated with a door, a deck lid, or the like, of the motor vehicle. In one embodiment, the linkage includes a Bowden cable 100 and a cable actuator 101. The cable actuator 101 includes a tubular section 102 for receiving and attaching to a core 103 of the Bowden cable 100 at one end, the opposite end of the core 103 being coupled to the latching mechanism 28 in any suitable manner as represented by the dashed line 29. The tubular section 102 is supported in the sleeve end 17. The tubular portion 40 of sleeve end 17 captures and retains the sheath 105 of the Bowden cable 100 via a grooveless retainer ring 106 which is positioned in a slot 107 in the tubular portion 40.

In one embodiment, the rotary motion of the barrel 18 which is transmitted to the driver 22 coupled thereto, is converted to linear motion, which through cable 100 operates the latching mechanism 28.

In one embodiment, the mechanism for converting rotary motion to linear is that commonly known as a Scotch Yoke. To this end, the protrusion 114 of driver 22 cooperates with a transverse groove 115 in the head of the cable actuator 101 for moving the cable actuator 101 and the cable 100 attached thereto, vertically up and down, as viewed in FIG. 18, in response to rotational movement of the lock barrel 18.

Slidebar

Figure 6:
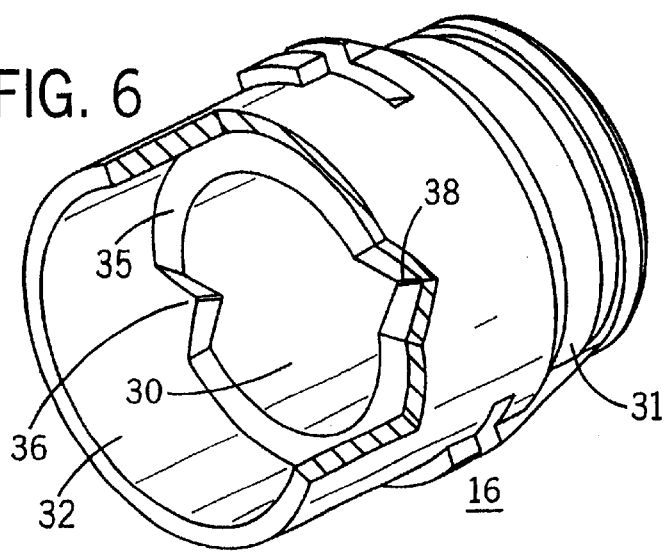
FIG. 6 is an isometric view of a sleeve of the lock assembly of FIG. 1, partially cut away to show the cam.

Referring to FIGS. 19–21, the slidebar 25 is generally rectangular in shape with an end 131 and an end 132. Slidebar 25 includes a cam follower protrusion 134 at end 131. The cam follower protrusion 134 is generally rectangular and includes a cam follower 135 which is directed forwardwardly and adapted to engage the cam surface 35 (FIG. 6) of the sleeve. In one embodiment, the profile of the cam follower 135 is that of a truncated rectangle, with a corner providing a flat forwardly directed face 135 with sloping sides 135a and 135b. The cam follower 135 is sized to be received in and ride along the sides of V-groove 38 of the sleeve 16 (FIG. 6). The flat face configuration of the cam follower 135 provides a bearing surface for cooperating with the flat face of cam surface 35. The slidebar 25 further includes a surface 136 which includes a plurality of notches. In one embodiment, the surface 136 includes three notches 121, 122 and 123. The notches 121–123 are spaced to correspond with the locations of the tumblers 20a, 20c, and 20e as shown in FIG. 2, for example.

Similarly, referring to FIGS. 22–24, the slidebar 26 includes a cam follower protrusion 138 at end 139. The cam follower protrusion 138 includes cam follower 140 in the shape of a truncated rectangle and includes a flat forwardly directed face with sloping sides 140a and 140b. The cam follower 140 is adapted to be received in and ride along the sides of the other cam surface 36 of the sleeve 16. The slidebar 26 further includes a surface 142 which in one embodiment includes three notches 124, 125 and 126. The notches 124–126 are spaced to correspond with locations of the tumblers 20b, 20d, and 20f shown in FIG. 2.

The axial cam profile of the sleeve 16 and the sleeve end 17 determine the angular orientation of the lock barrel 18 at the key removal position. Thus, while specific profiles of the cam surfaces 36 and 38 are shown in one embodiment, the profiles of the cam surfaces 36 and 38 can be constructed to provide more than one key removal position.

With reference to FIG. 25, in a further embodiment of the slidebar 145, the slidebar notches 121–123 include anti-pick grooves 151 included in the sides of the notches 121–123. Except for the anti-pick grooves 151, slide bar 145 is similar in function and structure to slidebars 25 and 26.

Referring also to FIG. 26, there is shown a mating tumbler 146 for use in free-wheeling lock which incorporates the slidebar 145. The tumbler 146 includes a plurality of grooves 147 on the side surfaces 148. The grooves 147 cooperate with corresponding anti-pick grooves 151 on the slidebar 145 to resist "picking" of the tumblers in the absence of the correct key in the key slot.

Operation

Figure 30:
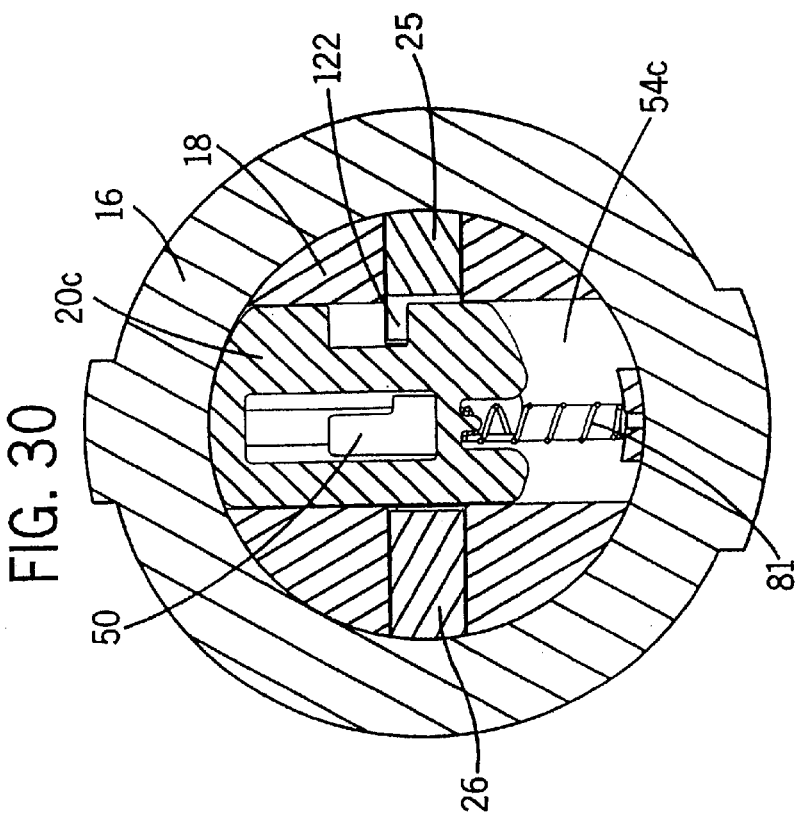
FIG. 30 is a vertical section view taken along the line 30—30 of FIG. 27.
Figure 29:
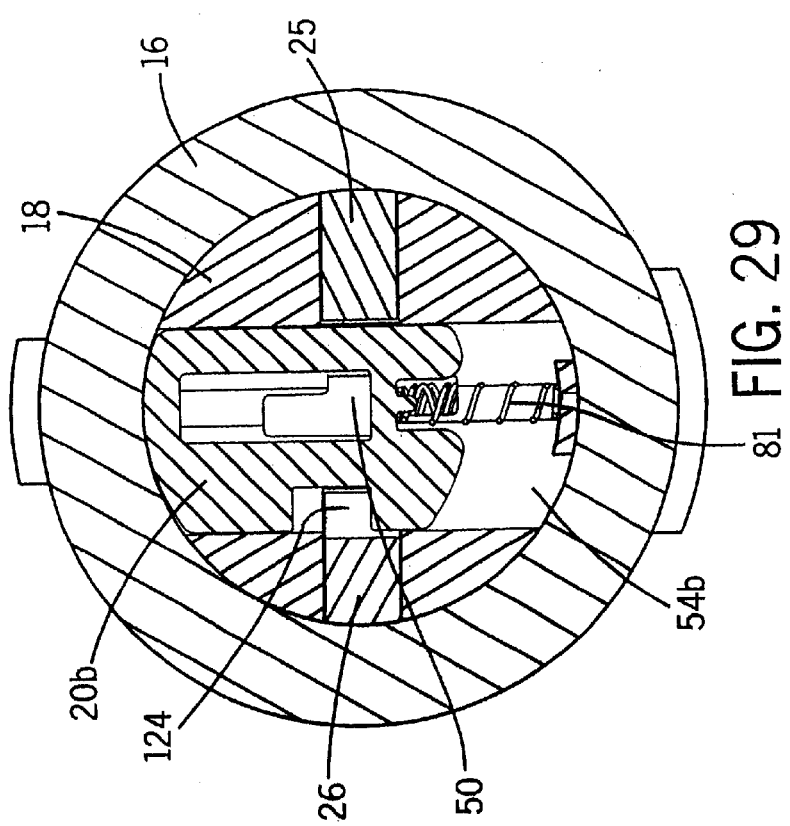
FIG. 29 is a vertical section view taken along the line 29—29 of FIG. 27.

Referring to FIGS. 27–30, in the absence of the mating key in the key slot, the tumblers 20a–20f are biased by tumbler springs 81 outwardly radially with respect to the tumbler wards, and engage the inner surface of the sleeve 16 as shown in FIG. 27, for example. For this condition, the lock barrel 18 and the slidebars 25 and 26 which are mounted in the lock barrel, can be rotated relative to the sleeve 16. However, the slidebars 25 and 26 are prevented from moving axially relative to the sleeve 16 because of the interference provided by the tumblers 22a–22g portions of which project into the notches 121–123 and 124–126 in the slidebars 25 and 26. For a key-out condition, the tumblers couple the slidebars to the lock barrel 18, as shown in FIGS. 28, 29 and 30, for example. Accordingly, the slidebars 25 and 26 can rotate with lock barrel 18 relative to the sleeve 16, but the slidebars 25 and 26 cannot move axially relative to the lock barrel.

Initially, the clutch mechanism formed by pin 69 in the lock barrel 18, the notches 97 on the driver and the bias spring 70, releasably couples the lock barrel 18 to the driver 22, allowing the driver 22 and the lock barrel 18 to rotate as a unit relative to the sleeve 16. However, if the lock barrel 18 is rotated when the mating key is not in the key slot, the clutch mechanism, releases the driver 22 from the lock barrel 18 as will be shown.

Referring to now FIGS. 1 and 2, when the mating or correctly coded key 14 is inserted into the barrel key slot 50, the tumblers 20a–20f are moved inwardly against the force of the tumbler springs 81 by the mating key in the known manner. Consequently, the tumblers 20a–20f become repositioned so that the notch 78 on the side of each of the tumblers, such as notch 78 for tumbler 20c (FIG. 4), becomes aligned with the corresponding the axial slidebar slot 121–123 and 124–126, as shown in FIGS. 3 and 4 for tumblers 20b and 20c, for example. The alignment of the notches 78 of the tumblers 20a, 20c and 20e with the edge 136 containing the notches 121–123 of slidebar 25 and the alignment of notches 78 of the tumblers 20b, 20d and 20f with edge 141 containing the notches 124–126 of slidebar 26 allow relative axial motion between slidebar 25 and lock barrel 18 and between slidebar 26 and lock barrel 18.

Figure 31A:
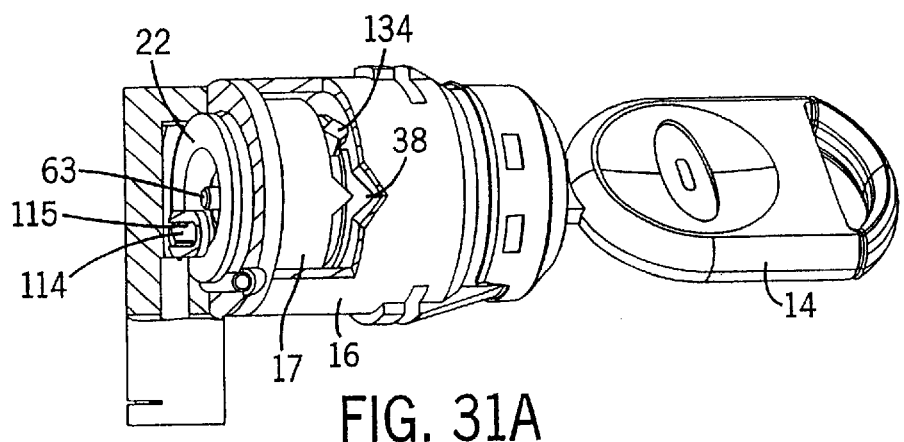
FIG. 31A is a view similar to that of FIG. 31, and with the lock barrel and the key rotated to an off-normal position.
Figure 32:
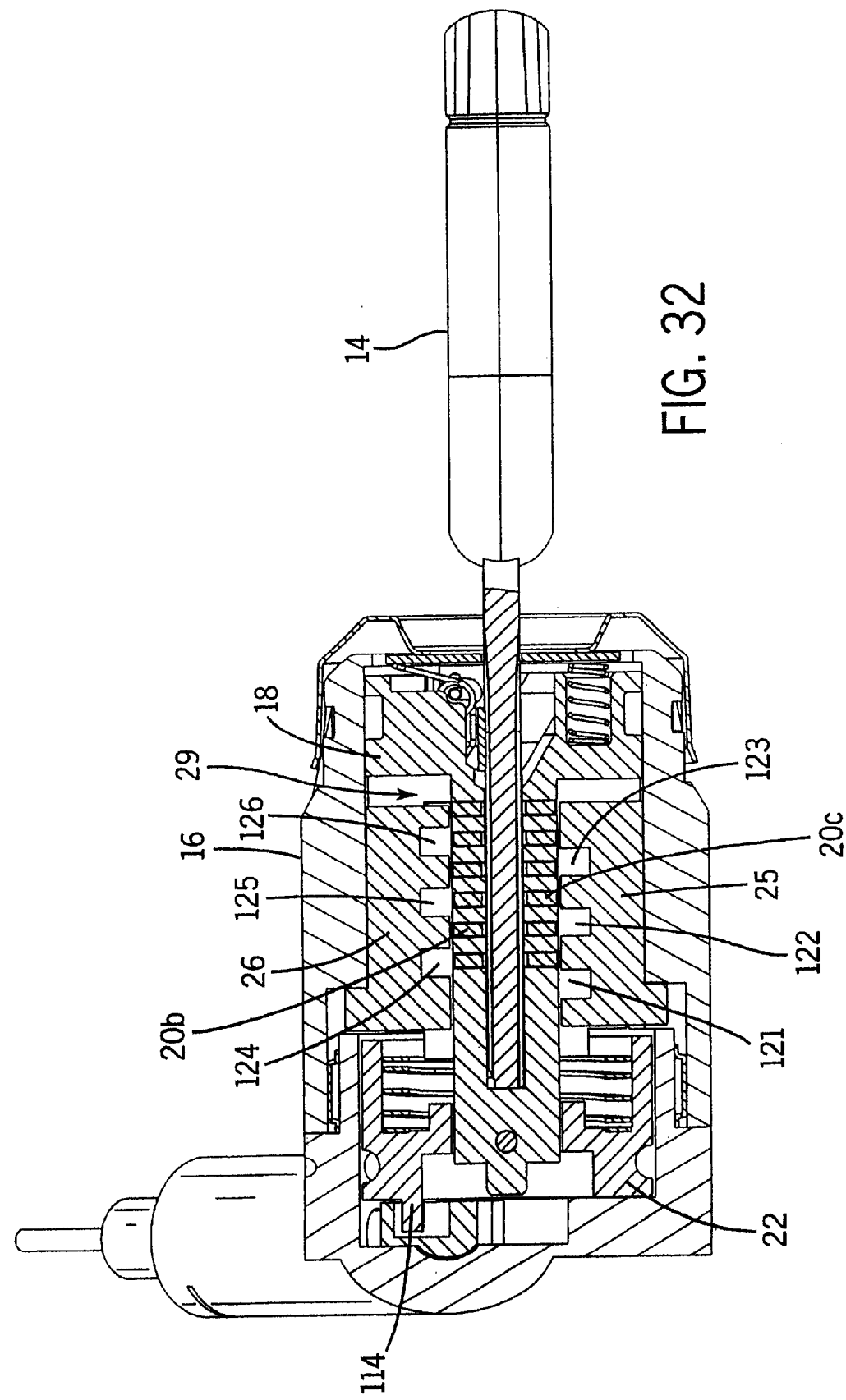
FIG. 32 is a transverse section view of the lock and key set as shown in FIG. 31A.

Reference is now made to FIGS. 31 and 31a, which are isometric views of the lock and key set, with the lock partially broken away to show the cam mechanism and with the tolerance ring removed, and to FIG. 32. With the properly coded key 14 located in the key slot, the cam follower 135 is located in the V-groove 38, as shown in FIG. 31 (and the cam follower 140 is located in the V-groove 36). Turning of the key in either direction rotates the lock barrel 18 which, in turn, rotates the driver 22 which is coupled to the lock barrel by the clutch mechanism including pin 69. Referring to FIGS. 31A and 32, as the lock barrel 18 is rotated relative to the sleeve 16 by the turning of the key 14, the cam followers 135 and 140 of the slidebars 25 and 26, respectively, are guided by the axial cam surfaces 36 and 38 of the sleeve 16 and the cam surface 43 of sleeve end 17, causing the slidebars 25, 26 to be displaced axially rearwardly, relative to the lock barrel 18, as indicated by arrow 29. The rearward translation of the slidebars 25 and 26 is evident by comparing the position of the slidebars 25 and 26 relative to the tumblers in FIGS. 32 and 2, for example.

Figure 33:
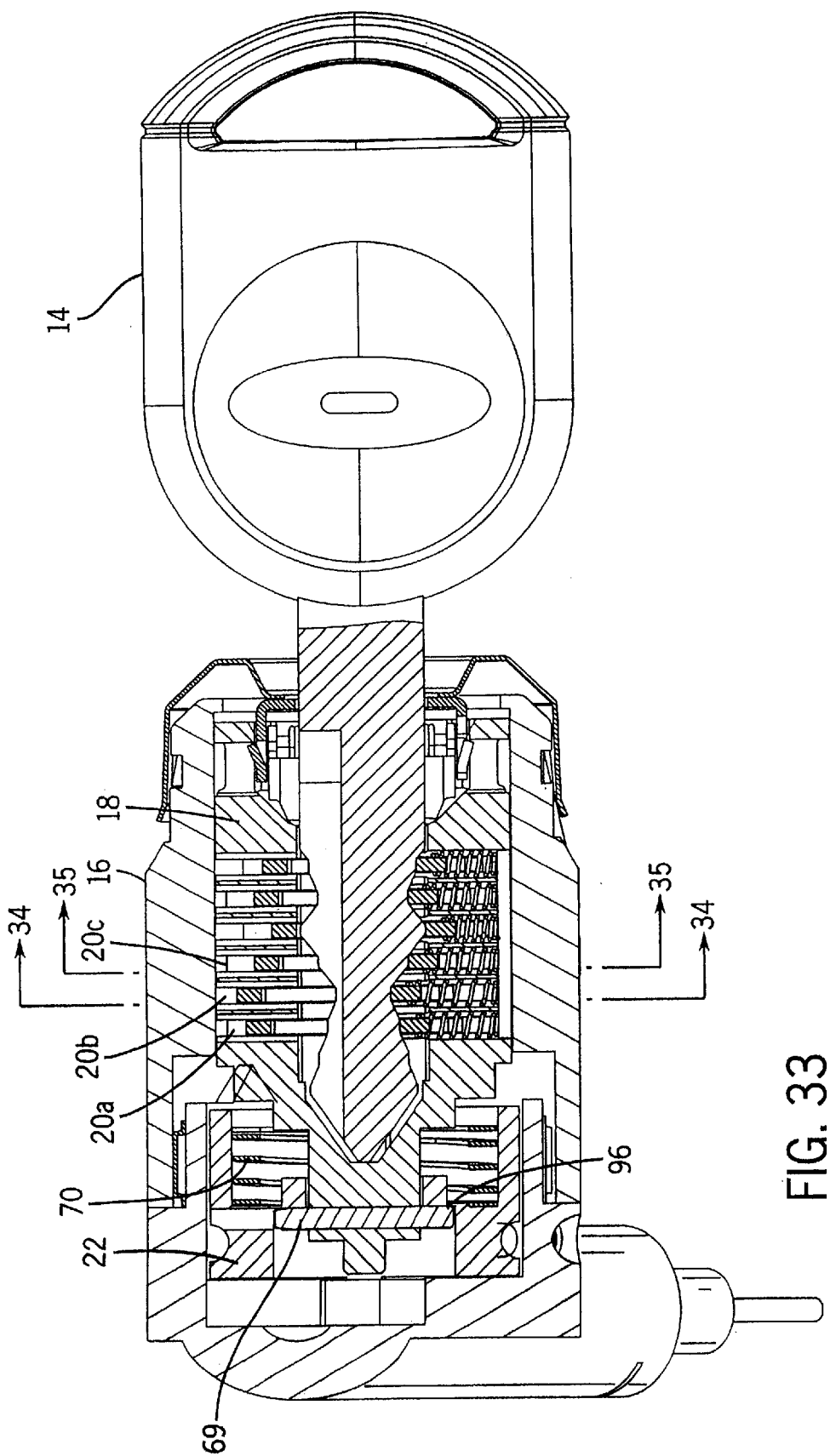
FIG. 33 is a vertical section view of the lock and key set of FIG. 1, and with the lock barrel rotated approximately 20° to an off-normal position.
Figure 35:
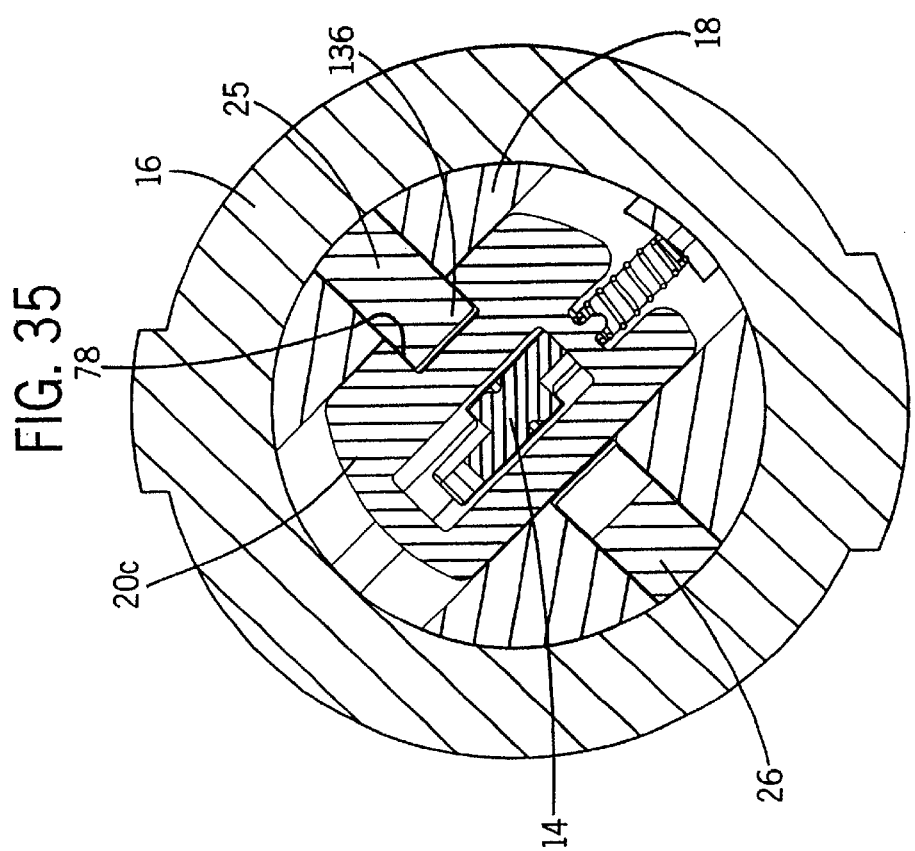
FIG. 35 is a vertical section view taken along the line 35—35 of FIG. 33.
Figure 34:
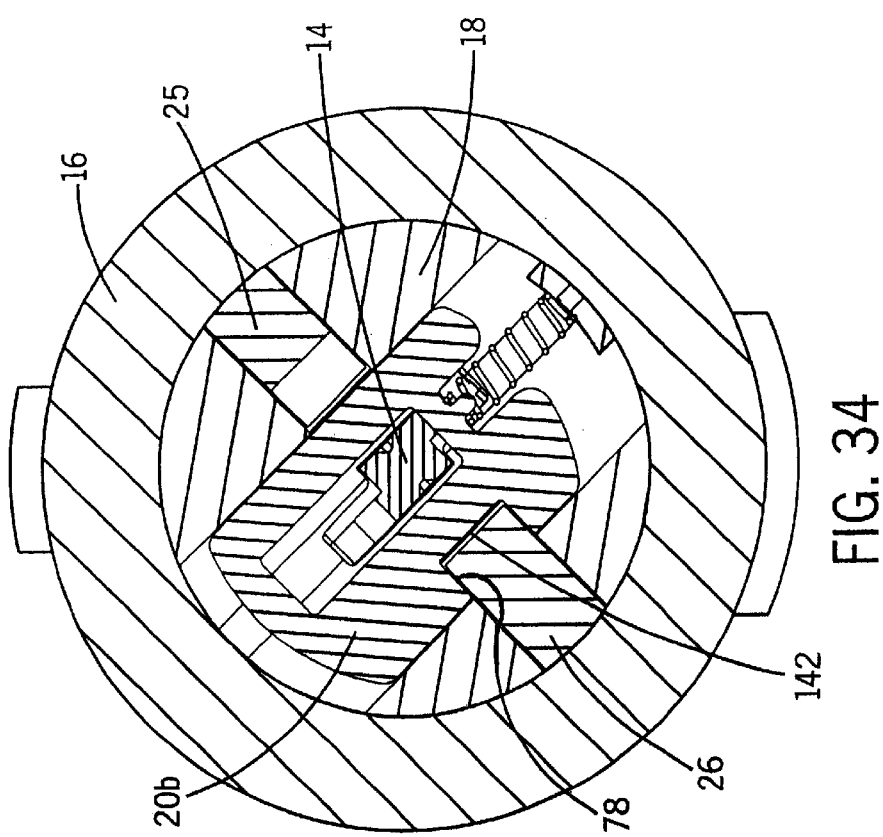
FIG. 34 is a vertical section view taken along the line 34—34 of FIG. 33.

Referring now to FIGS. 33–35, the axial displacement of the slidebars 25 and 26 causes the unnotched portion of the edge 136 of the slidebar 25 to become aligned with the notches 78 of tumblers 20a, 20c and 20e, and the unnotched portion of edge 142 of the slidebar 26 to become aligned with the notches 78 of tumblers 20b, 20d and 20f. The slidebars 25 and 26, as thus positioned, prevent further tumbler displacement within the tumbler wards 64, thereby preventing the key 14 from being withdrawn from the key slot until the slidebars 25 and 26 are moved forwardly subsequently, in response to rotation of the lock barrel 18 back to the normal of key removal position.

The rotary motion of the lock barrel 18 is transmitted to the driver 22 by the pin 69. The bias spring 70 acts upon the driver 22 and lock barrel 18 with an axial separating force, maintaining the pin 69 in engagement with the detent surface 96 (as shown in FIG. 36, for example) as the lock barrel rotates the driver 22.

Figure 36:
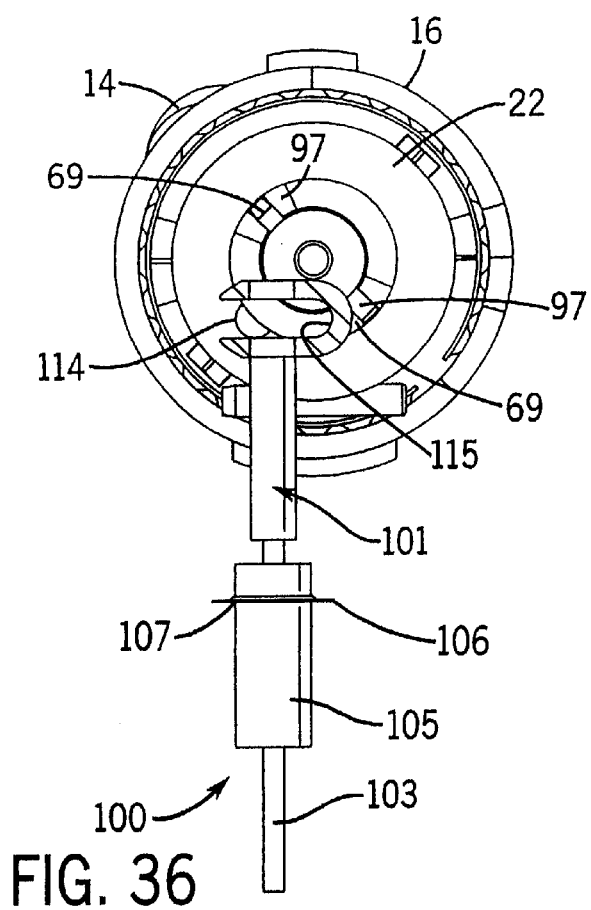
FIG. 36 is a view similar to that of FIG. 18 with the lock barrel rotated with the proper key approximately 20° to an off-normal position.

Referring also to FIGS. 31A and 36, the protrusion 114 of the driver 22 extends into the transverse groove 115 in the head of the cable actuator 101. Accordingly, as the lock barrel 18 is rotated by the key 14, the rotary motion of the lock barrel 18 (and the driver 22) is converted into a linear translation of the cable actuator 101 by the Scotch Yoke mechanism formed by projection 114 and groove 115, pushing or pulling the core 103 of the Bowden cable 100, depending upon the direction of rotation of the lock barrel. In the example, the cable actuator 101 is moved in the direction of arrow 108 as can be seen by comparing FIG. 36 with FIG. 18. FIG. 36 illustrates the cable actuator 101 displaced downwardly in response to rotation of the lock barrel away from a normal or key insertion/removal position. FIG. 18 illustrates the cable acutator 101 in the normal position, i.e., when the lock barrel 18 is in the key insertion/removal position. The pushing (or pulling) action of the core 103 of the Bowden cable 100 operates the latching mechanism 28.

Figure 37:
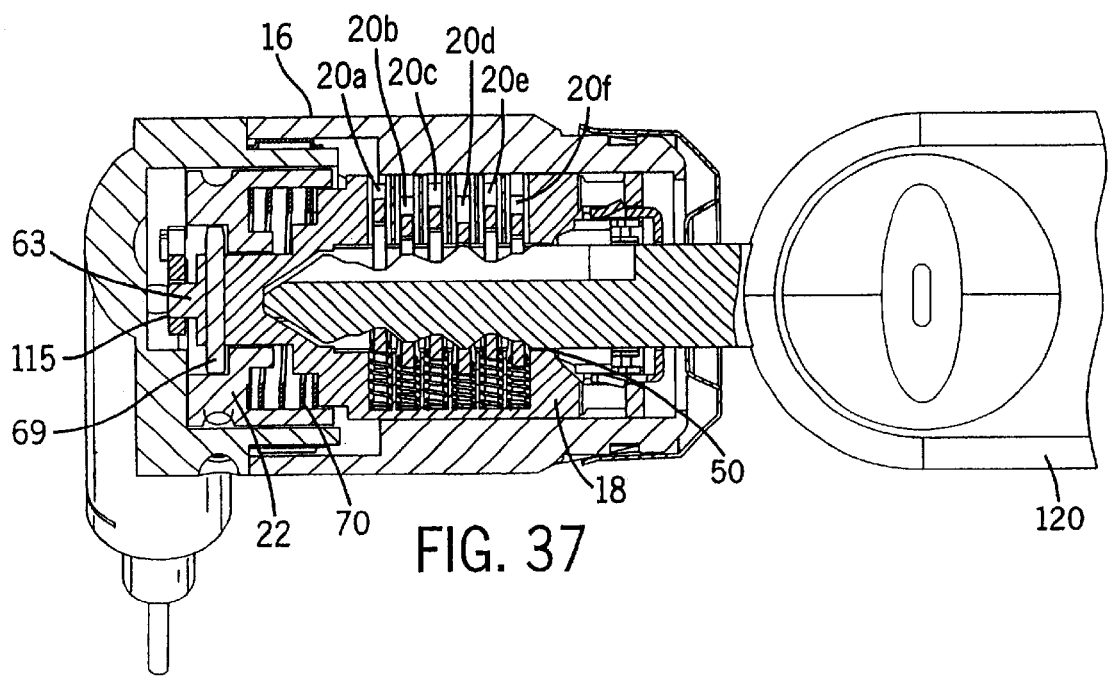
FIG. 37 is a vertical section view similar to that of FIG. 33 and with a wrong key inserted.
Figure 38:
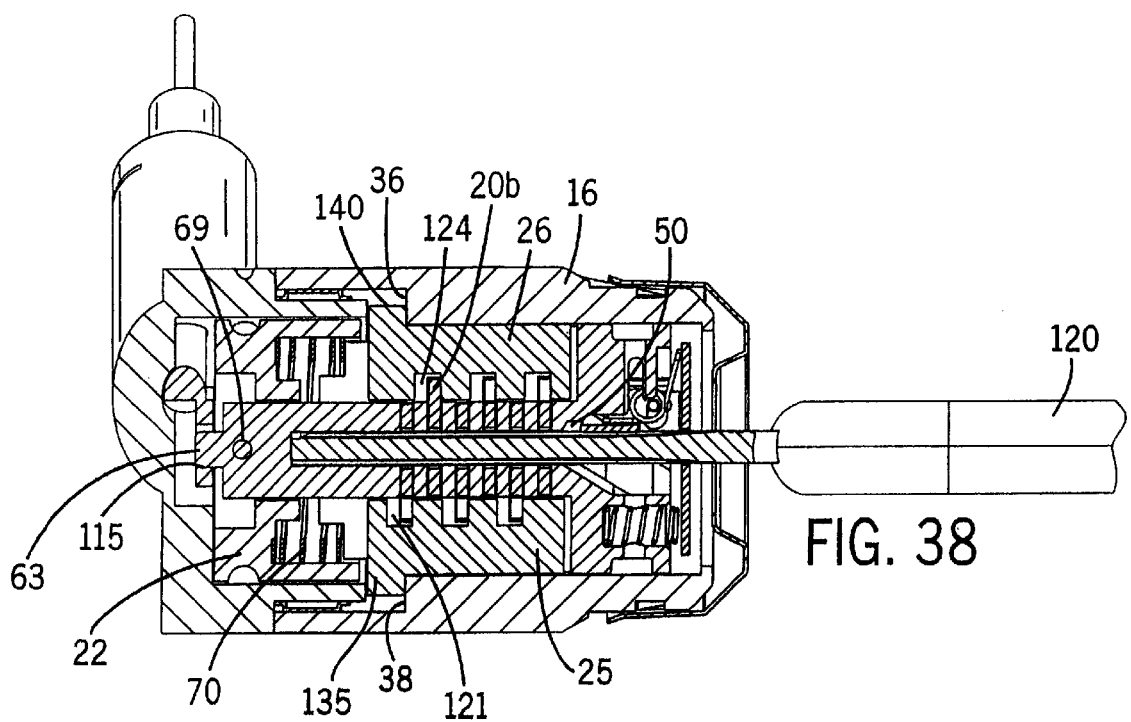
FIG. 38 is a transverse section view similar to that of FIG. 32 and with a wrong key inserted.

Referring to FIGS. 18 and 37–38, when a key 120 with the wrong code, or a tool of some sort, is inserted into the barrel key slot 50, at least some of the tumblers will not be moved inwardly to a position wherein the notch along the side of each tumbler is aligned with the corresponding axial notch in the associated slidebar. For example, as can be seen by comparing FIGS. 2 and 38, tumbler 20b is shown as not having been moved inwardly with respect to the slidebars 25 and 26. Consequently, notch 78 (FIG. 3) in the side of the tumbler 20b is not aligned with the notch 124 in slidebar 26. Rather a portion of tumbler 20b is located within the notch 124 and prevents axial movement of at least the slidebar 26. Therefore, relative axial motion between at least slidebar 26, and more typically between both of the slidebars 25 and 26, and the lock barrel 18 is prevented because of the engagement of tumbler 20b, for example, with the slidebar 26. Thus, the slidebar 25 and 26 are locked to the lock barrel by one or more tumblers, such as tumbler 20b in the example. Consequently, the cam follower portions 135 and 140 of the slidebars 25 and 26, respectively, in following the axial cam surfaces 36 and 38 of the sleeve 16 as the lock barrel is rotated, cause the lock barrel 18 to translate axially rearwardly, as shown in FIG. 31B, for example, compressing bias spring 70.

Figure 31B:
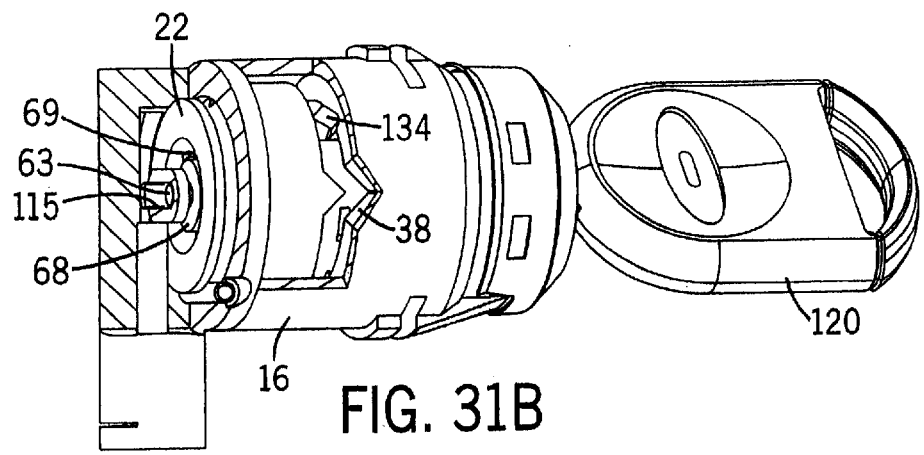
FIG. 31B is a view similar to that of FIG. 31, and showing that axial translation of the lock barrel when an improperly coded key is inserted and rotated to an off-normal position.

This rearward movement of the lock barrel causes the pin 69 be disengaged from the V-grooves 97 of the driver 22, as shown in FIGS. 18 and 31B. Thus, the driver 22 is decoupled from the lock barrel 18, 25 allowing the lock barrel 18 to rotate freely with respect to the driver 22.

Moreover, this axial translation of the lock barrel 18 also causes the rear tip 63 of the lock barrel 18 to enter the transverse groove 115 in the head of the cable actuator 101, as shown in FIGS. 31B, 37 and 38. This prevents the cable actuator 101 from being displaced or otherwise manipulated. For such condition, the lock barrel 18 can be rotated clockwise or counterclockwise in an unlimited manner without actuating the output mechanism, developing damaging forces on the components, or breaching the security provided by the lock assembly 10.

Figure 43:
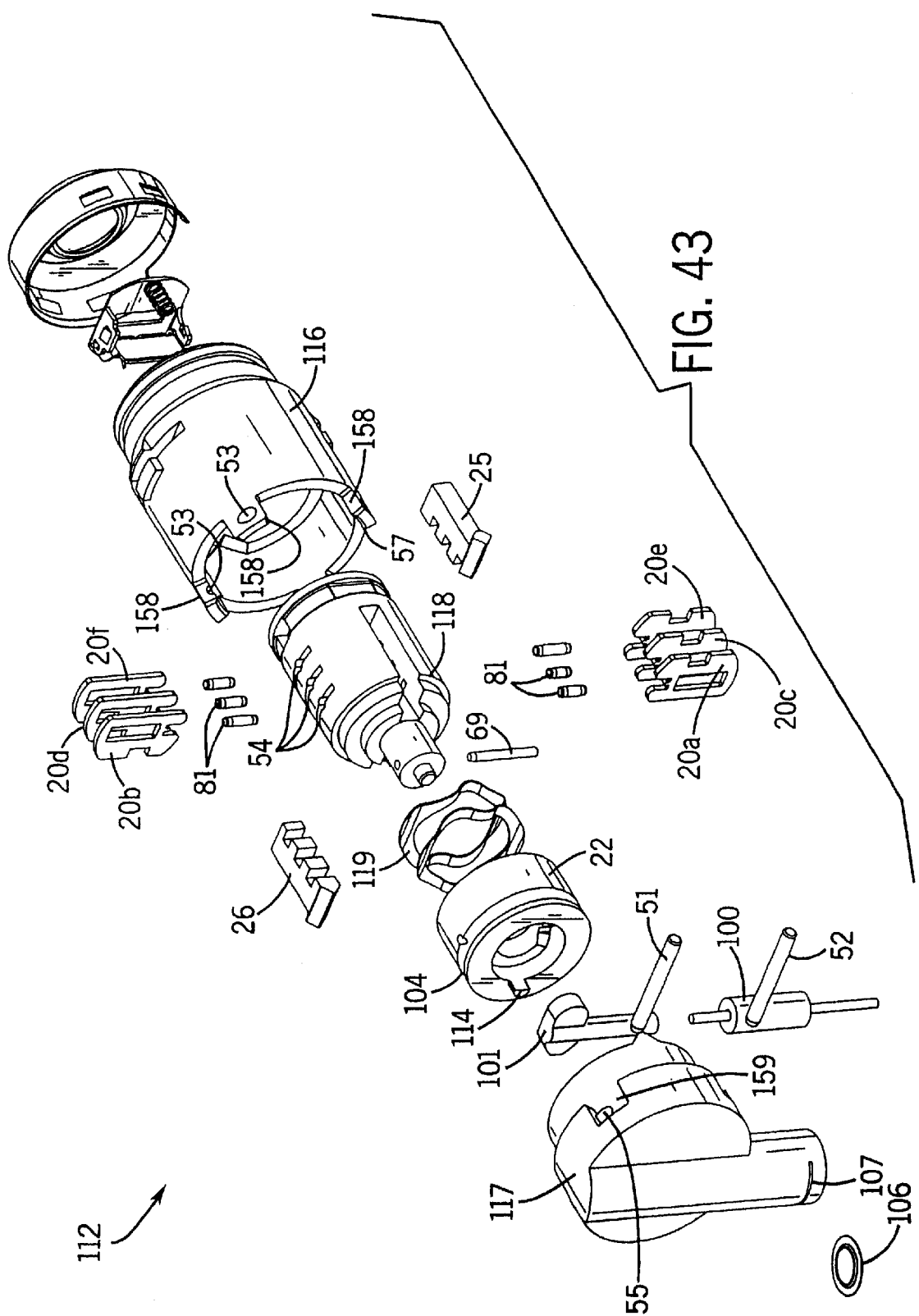
FIG. 43 is an exploded isometric view of a further embodiment of a lock and key set provided by the invention.

Referring to FIGS. 43, 44 and 45, there is shown a further embodiment for a lock assembly 112. The lock assembly 112 is generally similar in structure and operation to lock assembly 12 and accordingly, components of lock assembly 112 have been given the same reference numerals as corresponding components of lock assembly 12. However, for lock assembly 112 the sleeve has been given the reference numeral 116, the sleeve end has been given the reference numeral 117 and the lock barrel has been given the reference numeral 118. The bias structure which maintains axial separation between the driver 22 and the lock barrel 118 includes a bias element 119 of the type that provides a low to medium spring rate or large deflections with low to medium forces. One bias element suitable for this application is a Crest-to-Crest, plain ends wave spring, such as that commercially available from Smally Steel Ring Company, located in Wheeling Ill., 60090. Only the two end portions of the wave spring are shown in FIGS. 43 and 44 to simplify the drawings. The interconnection between the end portions of the wave spring are represented by dashed line 119a in FIG. 44. Although lock assembly 112 includes at least one wave spring for providing axial separation biasing between the driver and the lock barrel, it is apparent that other biasing means, including resilient, compressible material, vacuum, air pressure, rubber, magnets, etc. or other types of bias elements, such as squared-shim end wave springs, a flat spring or one or more coil springs, can be used.

In lock assembly 112, the stationary sleeve 116 and the sleeve end 117 of the lock assembly are securely joined by one or more coupling elements, such as dowel pins 51 and 52 rather than by the tolerance ring 41 for lock assembly 12. Dowel pin 51 extends through openings 53, in rearward extensions 158 of the sleeve, which are aligned with openings 55 in the sleeve end 117. The rearward extensions 158 are received in mating slots 159 in the sleeve end 117. Similarly, dowel pin 52 extends through aligned openings 57 and 59 in the sleeve 116 and the sleeve end 117. A portion of the dowel pins 51 and 52 is located in the circumferential groove 104 in the outer surface of the driver 22, securing the driver 22 to the sleeve 116. Thus, the dowel pins 51 and 52 prevent axial movement of the driver 22 with respect to the sleeve 116.

In addition, the tumbler wards 54 are alternately offset in the lock barrel 118. Moreover, the tumbler wards 54 open alternately to the top and bottom of the lock barrel 118 as shown best in FIG. 43. Thus, tumblers 20a, 20c and 20e are received in wards (not shown) located in the bottom portion of the lock barrel. Tumblers 20b, 20d and 20f are received in wards 54 located in the top portion of the lock barrel 118. This enables a double-throw tumbler arrangement to be used. Alternatively, the tumbler offset and throw can be arranged to allow one or many slidebars to be employed in the lock assembly 112.

Figure 47:
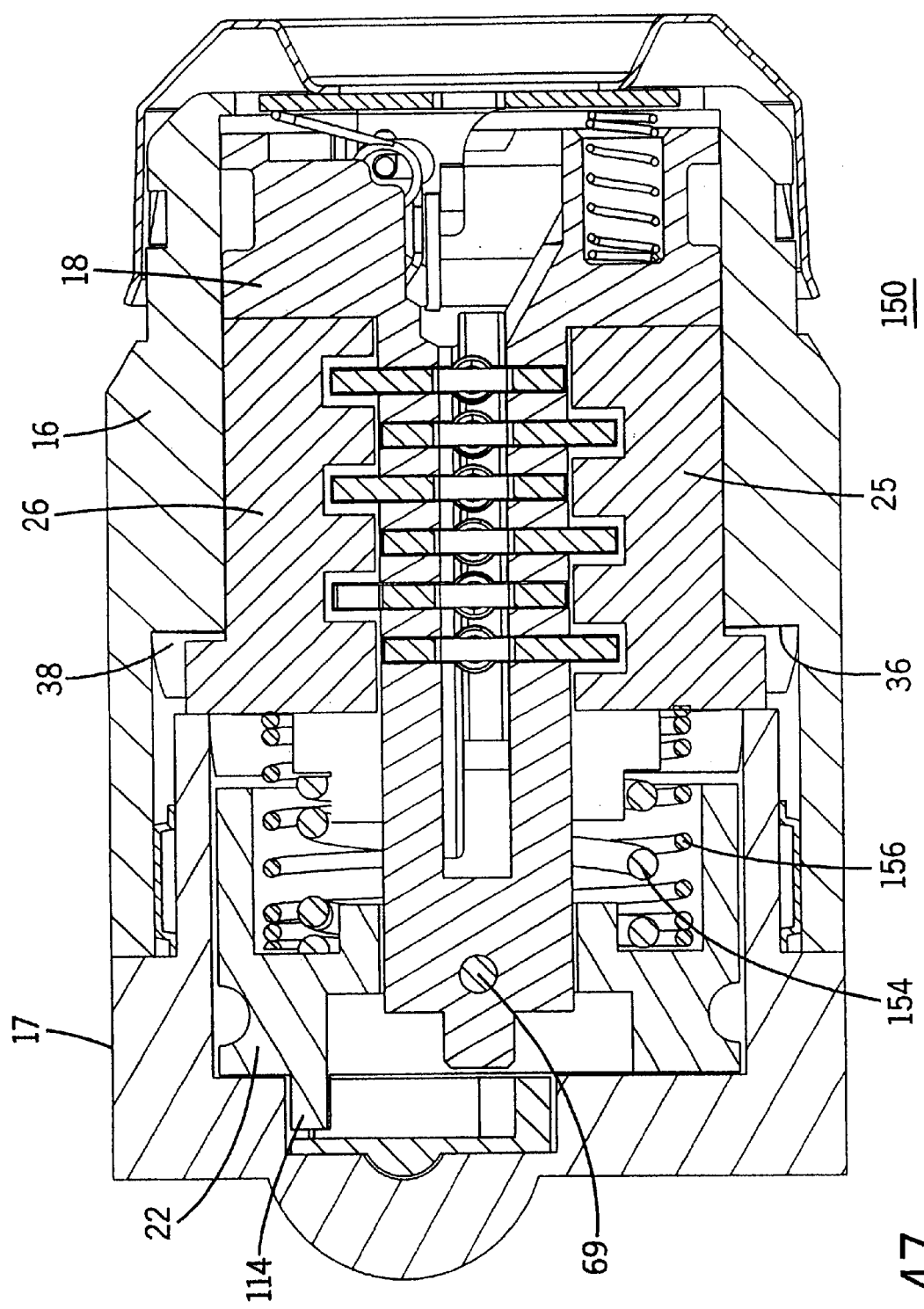
FIG. 47 is a vertical section view of the lock of FIG. 46.

Referring to FIGS. 46 and 47, there is shown a further embodiment for a lock assembly 150. Lock assembly 150 is similar in structure and operation to lock assembly 12 and accordingly, components of lock assembly 150 have been given the same reference numerals as corresponding components of lock assembly 12. The lock assembly 150 includes a round wire bias spring 154 which is interposed between the lock barrel 18 and the driver 22 to bias the lock barrel 18 axially apart from the driver 22 to maintain the pin 69 in the V-groove 97 in the driver 22, in the manner shown in FIG. 45, for example. In addition, the slidebars 25 and 26 are axially biased into engagement with the axial cam surfaces 36 and 38 of the sleeve 16 by a further round wire bias spring 156. In one embodiment, bias spring 154 is located within and is concentric with the bias spring 156. The bias spring 156 is interposed between the driver 22 and the slidebars 25 and 26.

As the lock barrel 18 is rotated back to the key insertion and removal or normal position, the action of the spring 156 produces a detent sensation as the slidebars 25 and 26 seat in the notches 36 and 38 of the cam surfaces 36 and 38 of the sleeve 16. This indicates to a person locking or unlocking the lock that the lock barrel 18 has been rotated back to the key insertion/extraction position and that the key can be removed from the lock barrel 18.

Figure 50:
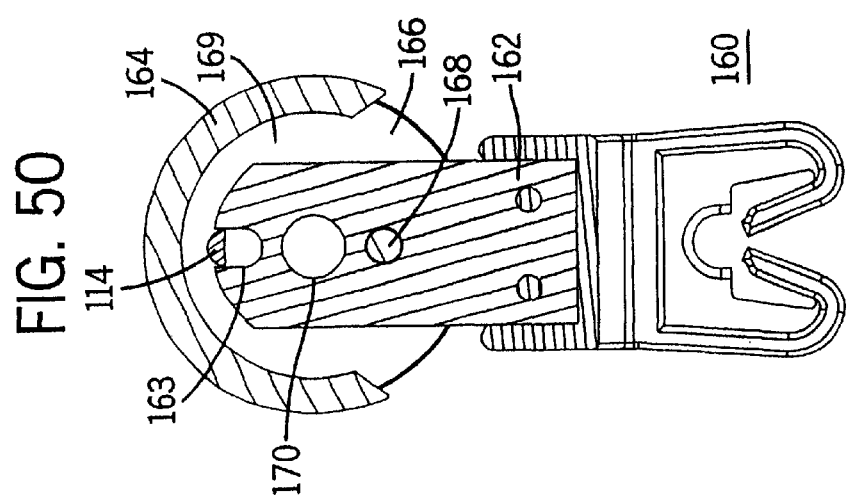
FIG. 50 is a vertical section view taken along the line 50—50 of FIG. 49.
Figure 49:
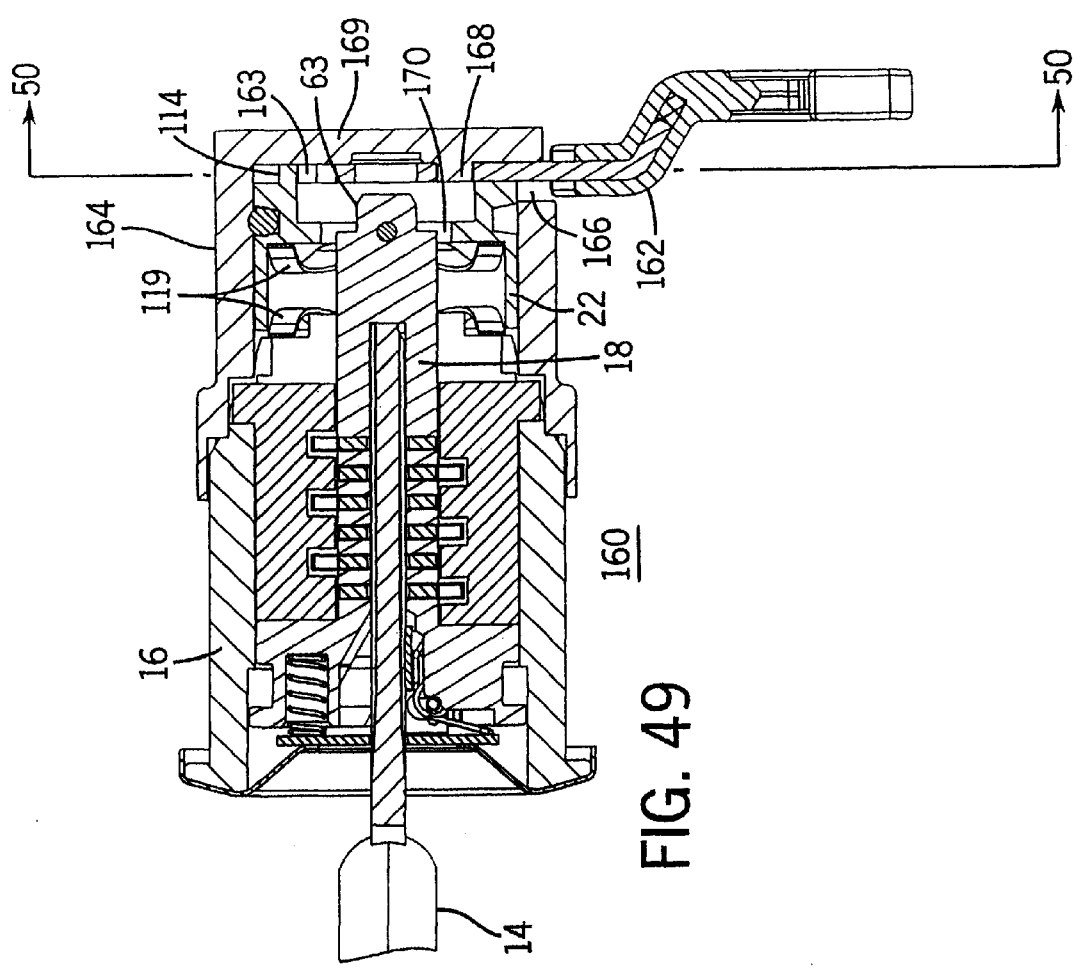
FIG. 49 is a transverse section view of the lock and key set of FIG. 48.

Referring to FIGS. 48, 49 and 50, there is shown a further embodiment for a lock assembly 160. Lock assembly 160 is similar in structure and operation to lock assembly 12, and accordingly, components of lock assembly 160 have been given the same reference numerals as corresponding components of lock assembly 12. Lock assembly 160 includes a Crest-to-Crest plain ends wave spring 119 for maintaining axial separation between the driver 22 and the lock barrel 18. However, other biasing means, including resilient, compressible material, vacuum, air pressure, rubber, magnets, etc. or other types of bias elements, such as squared-shim end wave springs, a flat spring or one or more coil springs, can be used.

In the lock assembly 12 (FIG. 1), the latching mechanism 28 is coupled to the lock assembly 12 by a lever, a rod, or any other suitable type of linkage. In contrast, the lock assembly 160 shown in FIGS. 48–50 includes a lever 162 which replaces the cable actuator 101. The lever 162 has a slot 163 at its distal end. The sleeve end 164 has a lever slot 166 and a pivot post 168 (FIG. 49) which projects forwardly from the rear wall 169 of the sleeve end 164.

When the lock barrel 18 is rotated by turning of the key, the protrusion 114 located on the back of driver 22 is located within slot 163 of the lever to cause the lever 162 to rotate about the pivot post 168. The amount of angular rotation of the lever 162 is limited by the size of the lever slot 166. In one embodiment, the lever slot 166 extends along approximately one-third the circumferential length of the sleeve end 164.

If a wrong key, or some other tool, is inserted into the lock assembly 160 and rotated, upon rotation of the lock barrel 18, the lock barrel 18 is translated rearwardly due to the camming action of cams on surfaces 36 and 38 of the cam follower 135 and 140 of the slidebars 25 and 26, as described above for the wrong key condition for lock assembly 12. The axial translation of the lock barrel 18 rearwardly, causes the end 63 of the lock barrel 18 to enter the opening 170 in the lever 162, thereby preventing significant displacement of the lever 162.

Similarly, if an attempt is made to breach the security of the lock solely by attempting to displace the lever 162, partial rotation of the driver 22 causes the pin 69 to follow the V-groove 97 in the surface 96 of the driver 22, resulting in rearward axial translation of the lock barrel 18. The rearward axial translation of the lock barrel 18 causes the end 63 of the lock barrel 18 to enter opening 170 in the lever 162, preventing further rotation of the lever 162.

Although exemplary embodiments of the present invention have been shown and described with reference to particular embodiments and applications thereof, it will be apparent to those having ordinary skill in the art that a number of changes, modifications, or alterations to the invention as described herein may be made, none of which depart from the spirit or scope of the present invention. All such changes, modifications, and alterations should therefore be seen as being within the scope of the present invention.

What is claimed is:

1. A lock assembly for operating a latching mechanism between locked and unlocked conditions, the lock assembly comprising:
    a case;
    a drive mechanism including a lock barrel and a driver, the lock barrel being supported within the case for rotational and axial movement relative to the case, the lock barrel having a key slot and at least one tumbler located adjacent to said key slot to be operated between locking and releasing positions as a function of the presence and absence of a mating key in the key slot, the driver coupled to the latching mechanism, and the lock barrel releasably coupled to the driver; and
    the drive mechanism further including at least one translation member disposed within the case for at least axial movement relative to the case in response to rotation of the lock barrel, said translation member coupled to said lock barrel when said one tumbler is in said locking position to prevent relative axial movement between said translation member and the lock barrel,
    rotation of the lock barrel when said one tumbler is in the releasing position causing the translation member and the driver to rotate, operating the latching mechanism between the locked and unlocked conditions, and rotation of the lock barrel when said one tumbler is in the locking position causing the lock barrel to be decoupled from the driver, whereby rotation of the lock barrel is ineffective to cause the driver to operate the latching mechanism between the locked and unlocked conditions.

2. The lock assembly according to claim 1, wherein said one tumbler couples said translation member to said lock barrel when said one tumbler is in said locking position, whereby the lock barrel is translated axially away from a first position in response to rotation of the lock barrel relative to the case, and when said one tumbler is in the releasing position, said tumbler allowing relative axial movement between said translation member and the lock barrel in response to rotation of the lock barrel relative to the case.

3. The lock assembly according to claim 1, and including at least one bias element providing an axial bias force that biases the lock barrel axially into engagement with the driver, said translation member causing the lock barrel to be translated axially against the axial bias force, disengaging the lock barrel from the driver when the lock barrel is rotated in the absence of the mating key in the key slot.

4. A lock assembly for operating a latching mechanism between locked and unlocked conditions, the lock assembly comprising:
    a case;
    a drive mechanism coupled to the latching mechanism, the drive mechanism including a lock barrel supported within the case for rotational and axial movement relative to the case, the lock barrel having a key slot and at least one tumbler located adjacent to said key slot to be operated between locking and releasing positions as a function of the presence and absence of a mating key in the key slot; and
    the drive mechanism including at least one translation member disposed within the case for at least axial movement relative to the case in response to rotation of the lock barrel,
    said tumbler coupling said translation member to said lock barrel when said tumbler is in said locking position, to cause said translation member to translate the lock barrel axially away from a first position as the lock barrel is rotated relative to the case,
    and when said tumbler is in the releasing position, said tumbler allowing relative axial movement between said translation member and the lock barrel in response to rotation of the lock barrel relative to the case.

5. The lock assembly according to claim 4, wherein the case includes a sleeve having a cam surface, disposed adjacent to said translation member, and wherein said translation member defines a cam follower for moving along the cam surface when the lock barrel is rotated with respect to the sleeve, thereby moving said translation member axially with respect to the sleeve.

6. The lock assembly according to claim 4, wherein said translation member is an elongated element and wherein the lock barrel supports said element for axial movement at least relative to the case.

7. The lock assembly according to claim 6, wherein said tumbler decouples said translation member from the lock barrel when the tumbler is in the unlocking position, allowing said translation member to be moved axially relative to the lock barrel and the case.

8. The lock assembly according to claim 4, wherein the drive mechanism further includes an actuator interposed between the lock barrel and the latching mechanism, and wherein the lock barrel includes a projection which is received by a recessed portion of the actuator when the lock barrel is translated axially from the first position to a second position to substantially prevent displacement of the actuator.

9. The lock assembly according to claim 8, wherein the actuator converts rotational motion of the lock barrel to linear motion.

10. The lock assembly according to claim 8, wherein the actuator includes a lever which the driver and pivots in response to rotation of the driver.

11. A lock assembly for operating a latching mechanism between locked and unlocked conditions, the lock assembly comprising:
    a case;
    a drive mechanism coupled to the latching mechanism, the drive mechanism including a lock barrel supported within the case for rotational and axial movement relative to the case, the lock barrel having a key slot and a plurality of tumblers mounted within tumbler wards to be operated from a locking position to a releasing position in response to insertion of a mating key into the key slot; and the drive mechanism including at least first and second slidebars supported within said case for at least axial movement relative to said case, the tumblers preventing relative axial movement between the slidebars and the lock barrel when the tumblers are in the locking position, and the tumblers permitting relative axial movement between the first and second slidebars and the lock barrel when the tumblers are in the releasing position.

12. The lock assembly according to claim 11, wherein the tumblers couple the first and second slidebars to the lock barrel when the tumblers are in the locking position, preventing the first and second slidebars from being moved axially relative to the lock barrel and the case.

13. The lock assembly according to claim 11, wherein the first and second slidebars cooperate with the tumblers to prevent withdrawal of the key from the lock barrel when the lock barrel is rotated away from a key removal position.

14. The lock assembly according to claim 11, wherein the first and second slidebars are located on opposite sides of the lock barrel and are offset with respect to the axis of the lock barrel.

15. The lock assembly according to claim 11, wherein the first and second slidebars are located on a common side of the lock barrel.

16. The lock assembly according to claim 11, wherein the lock barrel includes first and second channels, the first and second slidebars being located within the first and second channels, respectively for axial sliding movement with respect to the lock barrel.

17. The lock assembly according to claim 11, wherein the first slidebar includes a first edge including a first plurality of notches, and the second slidebar includes a second edge including a second plurality of notches.

18. The lock assembly according to claim 17, wherein at least a portion of the tumblers extends into the notches in the first and second edges of the first and second slidebars to prevent relative axial motion between the lock barrel and the first and second slidebars when the tumblers are in the locking position, whereby the tumblers couple the first and second slidebars to the lock barrel, allowing the first and second slidebars to follow an axial cam surface of the case and cause the lock barrel to axially translate with respect to the case.

19. The lock assembly according to claim 18, wherein the plurality of tumblers include a first plurality of tumblers and a second plurality of tumblers, each of the first plurality of tumblers including a tumbler notch located along one side thereof which is disposed adjacent to the notched edge of the first slidebar, and each of the second plurality of tumblers including a tumbler notch located along one side thereof which is disposed adjacent to the notched edge of the second slidebar, the tumbler notches being aligned with the notch bearing edges of the first and second slidebars when the mating key is present in the key slot.

20. The lock assembly according to claim 11, wherein the lock barrel defines first and second slidebar slots receiving the first and second slidebars respectively, and wherein the tumbler wards include a first plurality of tumbler wards communicated with the first slidebar slot and a second plurality of the tumbler wards communicated with the second slidebar slot.

21. The lock assembly according to claim 20, wherein the tumblers are offset alternately along the lock barrel.

22. The lock assembly according to claim 20, wherein alternate tumblers are moved to opposite sides of the lock barrel in response to the insertion of the mating key into the key slot.

23. The lock assembly according to claim 11, wherein the drive mechanism further includes a driver, the lock barrel including at least one projection located adjacent to the driver, and at least one bias element for biasing the projection into engagement with the driver, the first and second slidebars translating the lock barrel away from the driver for disengaging the projection from the driver in response to rotation of the lock barrel relative to the case in the absence of the mating key in the key slot.

24. The lock assembly according to claim 23, wherein the driver includes at least one V-shaped notch, the at least one projection being maintained in the notch when the lock barrel is located in a first axial position and moved out of the notch when the lock barrel is moved axially relative to the case.

25. The lock assembly according to claim 23, wherein the drive mechanism further includes an actuator interposed between the driver and the latching mechanism, and wherein the lock barrel includes a further projection at its distal end, the further projection being received in an opening of the actuator, preventing displacement of the actuator when the lock barrel is translated axially by the first and second slidebars away from the first axial position.

26. The lock assembly according to claim 23, wherein the case includes a sleeve having a first cam surface disposed adjacent to the first and second slidebars, the first and second slidebars each defining a cam follower for engaging the first cam surface and moving along the first cam surface in response to rotation of the lock barrel with respect to the case, thereby moving the first and second slidebars axially with respect to the sleeve.

27. The lock assembly according to claim 26, wherein the case further includes a sleeve end, the sleeve and the sleeve end being joined by at least one coupling element, and wherein the sleeve end includes a second cam surface which provides return axial translation of the slidebars relative to the lock barrel when the lock barrel is rotated toward a ky out position.

28. The lock assembly according to claim 27, wherein at least one of the coupling elements engages the driver, preventing axial movement of the driver.

29. A lock assembly for operating a latching mechanism between locked and unlocked conditions, the lock assembly comprising:

a sleeve;

a lock barrel mounted within the sleeve for axial and rotational movement relative to the sleeve, the lock barrel having a channel, a key slot and at least one tumbler located to be operated to a releasing position in response to insertion of a mating key into the key slot;

a driver mounted within the sleeve for rotational movement relative to the sleeve;

a coupling mechanism for releasably coupling the driver to the lock barrel to allow the driver to rotate with the lock barrel when the lock barrel is rotated while the mating key is present in the key slot; and a translation mechanism including a slidebar at least partially received by the channel, the translation mechanism coupled between the sleeve and the lock barrel for moving the lock barrel axially relative to the driver, in response to rotation of the lock barrel in the absence of the mating key in the key slot, thereby releasing the coupling mechanism to permit relative rotational movement between the lock barrel and the driver.

30. The lock assembly according to claim 29, wherein the coupling mechanism includes a projection disposed adjacent to said driver, and a bias structure biasing the lock barrel axially to cause the projection to engage the driver, and wherein the slidebar is engagable to cause the lock barrel to move axially, disengaging the projection from the driver when the lock barrel is rotated in the absence of [a] the mating key in the key slot.

31. The lock assembly according to claim 30, wherein the slidebar includes an edge having at least one notch, and wherein at least a portion of said one tumbler extends into the notch when the mating key is not present in the key slot.

32. The lock assembly according to claim 30, wherein the slidebar is located in the channel for sliding movement with respect to the lock barrel when the mating key is present in the key slot.

33. The lock assembly according to claim 30, wherein the bias structure comprises at least one spring member having a generally rectangular cross section.

34. The lock assembly according to claim 30, wherein the bias structure includes a first bias member and a second bias member, said first bias member interposed between said slidebar and said case; said second bias member interposed between said driver and said lock barrel.

35. The lock assembly according to claim 34, wherein the first bias member is a first coil spring and the second bias member is a second coil spring, said first and second coil springs being disposed in a concentric relation.

36. The lock assembly according to claim 34, wherein the first bias member provide a detent feel to a user of the lock.

* * * * *